United States Patent [19]
Gooch

[11] Patent Number: 5,153,796
[45] Date of Patent: Oct. 6, 1992

[54] METHOD AND APPARATUS FOR TRANSFERRING INFORMATION BETWEEN TWO MAGNETIC BODIES USING A THIRD BODY OF MAGNETIC MATERIAL

[75] Inventor: Beverley R. Gooch, Sunnyvale, Calif.

[73] Assignee: Ampex Corporation, Redwood City, Calif.

[21] Appl. No.: 85,676

[22] PCT Filed: Dec. 15, 1986

[86] PCT No.: PCT/US86/02733
§ 371 Date: Aug. 6, 1987
§ 102(e) Date: Aug. 6, 1987

Related U.S. Application Data

[63] Continuation-in-part of Ser. No. 808,588, Dec. 13, 1985, abandoned, Ser. No. 715,211, Mar. 22, 1985, abandoned, Ser. No. 808,924, Dec. 13, 1985, abandoned, Ser. No. 829,592, Feb. 13, 1986, Pat. No. 5,119,255, and Ser. No. 843,453, Mar. 24, 1986, said Ser. No. 808,588, is a continuation-in-part of Ser. No. 815,211, , Ser. No. 829,892. , and Ser. No. 815,211, , each is a continuation-in-part of Ser. No. 641,817, Aug. 16, 1984, abandoned, said Ser. No. 843,453, is a continuation-in-part of Ser. No. 829,592, , Ser. No. 715,211, , Ser. No. 808,588, , and Ser. No. 808,924.

[51] Int. Cl.⁵ .................. G11B 5/187; G11B 5/23; G11B 5/127
[52] U.S. Cl. ................... 360/115; 360/119; 360/122; 360/125
[58] Field of Search .............. 360/115, 119, 123, 125, 360/55, 137, 122, 128, 120

[56] References Cited

U.S. PATENT DOCUMENTS

| | | | |
|---|---|---|---|
| 3,079,468 | 2/1963 | Morey | 360/119 |
| 3,084,227 | 4/1963 | Peters | 360/115 |
| 3,106,617 | 10/1963 | Fox | 360/119 |
| 3,188,399 | 6/1965 | Eldridge | 179/100.2 |
| 3,255,307 | 6/1966 | Schuller | 360/119 |
| 3,314,056 | 4/1967 | Lawrance | 360/119 |
| 3,391,254 | 7/1968 | Honig | 360/115 |
| 3,435,440 | 3/1969 | Nallin | 360/115 |
| 3,555,204 | 1/1971 | Braun | 360/115 |
| 4,277,809 | 7/1981 | Fisher et al. | 360/131 |
| 4,318,136 | 3/1982 | Jeffers | 360/17 |
| 4,530,016 | 7/1985 | Sawazaki | 360/55 |
| 4,535,369 | 8/1985 | Sawazaki | 360/55 |

FOREIGN PATENT DOCUMENTS

1163283 9/1969 United Kingdom .

OTHER PUBLICATIONS

J. Flora and J. R. Werning, "Multitrack Probe Type Recording Transducer", IBM Technical Disclosure Bulletin, vol. 3, No. 11, p. 15, Apr. 1961.

*Primary Examiner*—Robert S. Tupper
*Attorney, Agent, or Firm*—James A. LaBarre; C. Michael Zimmerman; Ralph L. Mossino

[57] ABSTRACT

Apparatus is described for coupling magnetic flux defining information between a first body of magnetic material and a second body of magnetic material having a magnetic flux path therein. A third body of magnetic material having a transducing zone is included and disposed to be magnetically proximate the first body of magnetic material to couple flux to or from the same, and to have a portion thereof magnetically proximate the magnetic flux path within the second body of magnetic material to provided coupling of flux to or from such flux path. In specific embodiments described, the first body of magnetic material is a magnetic storage medium such as a layer of hard magnetic material of a tape, and the second body of material is a transducer core of a soft magnetic material.

61 Claims, 14 Drawing Sheets

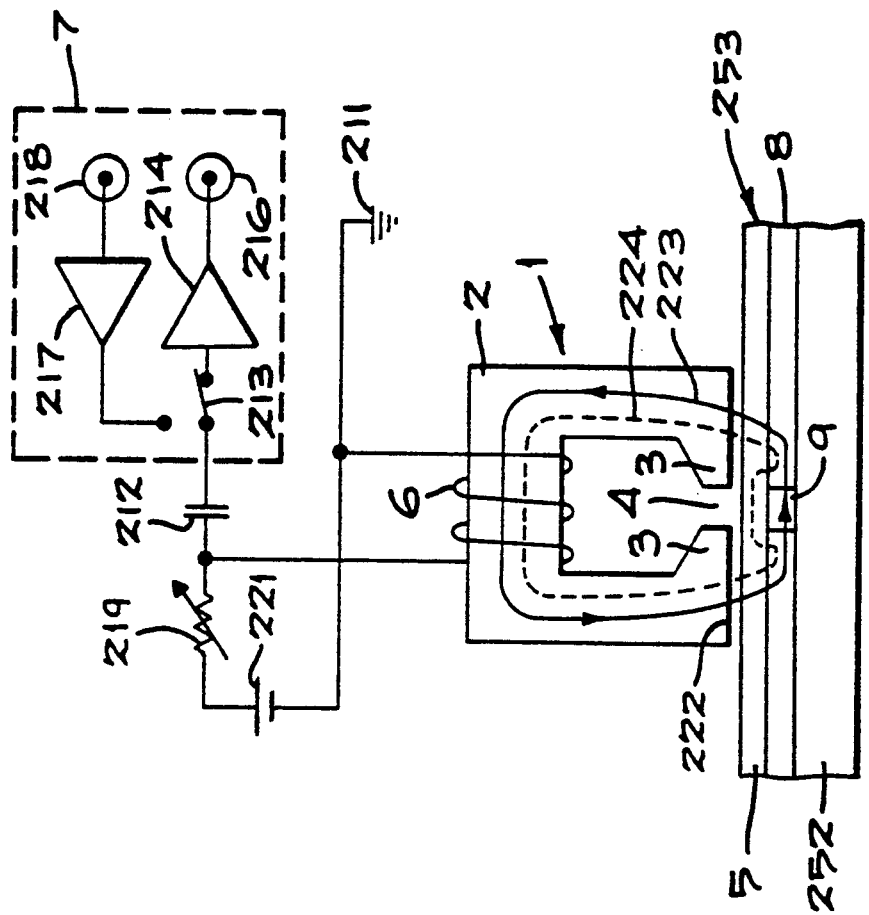
FIG_1A
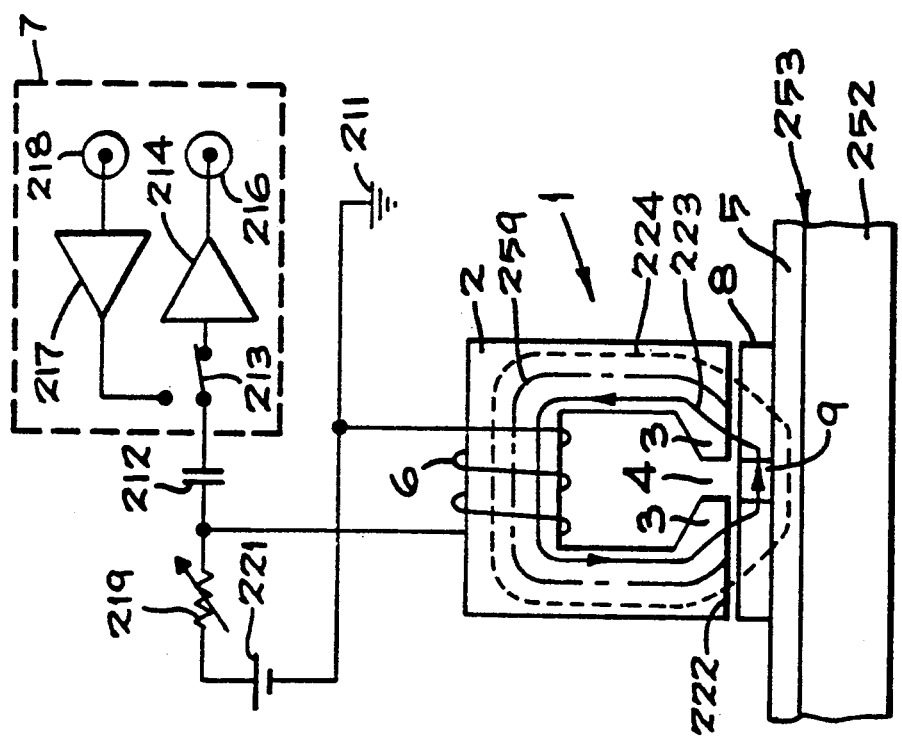
FIG_1B

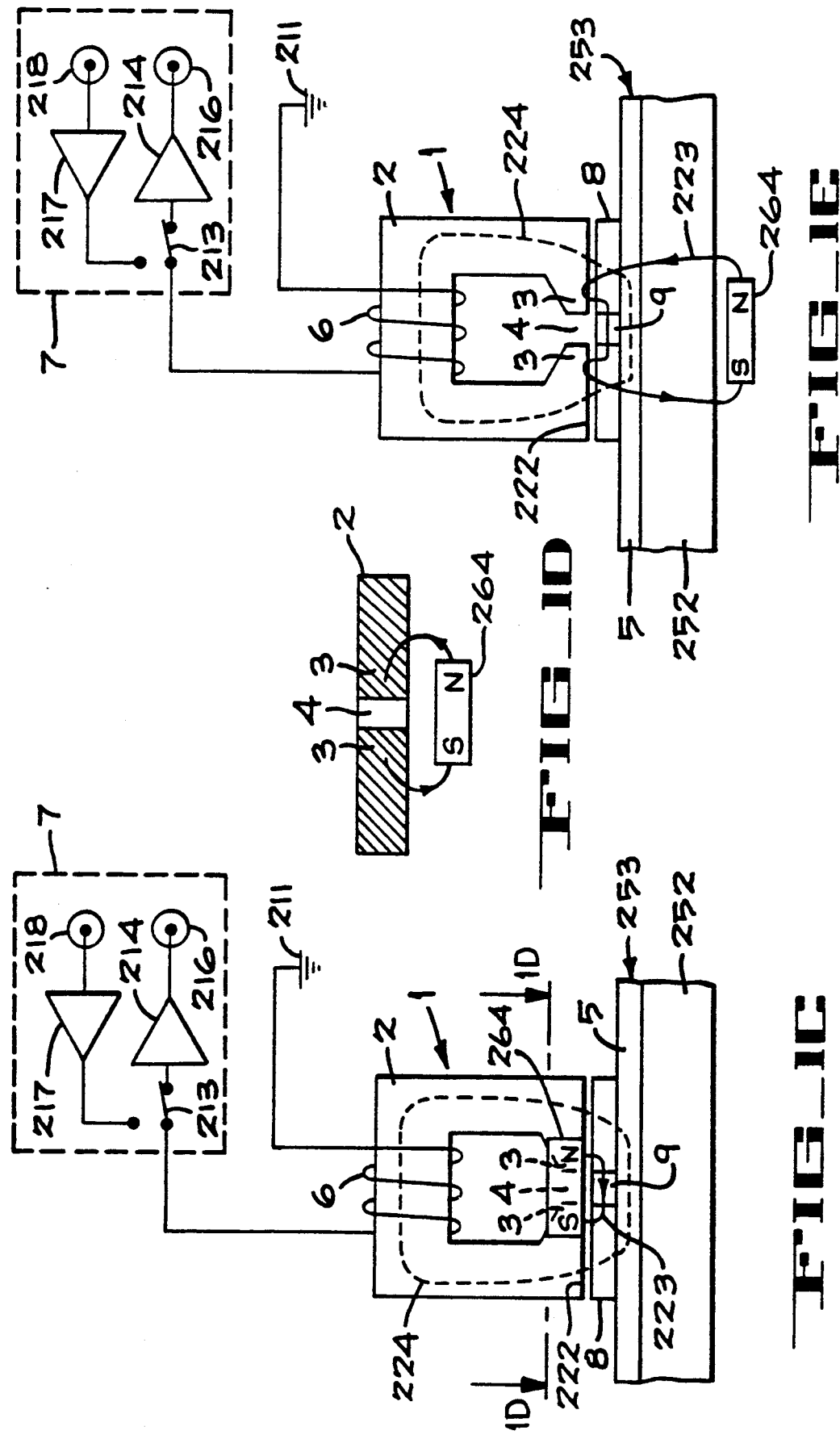

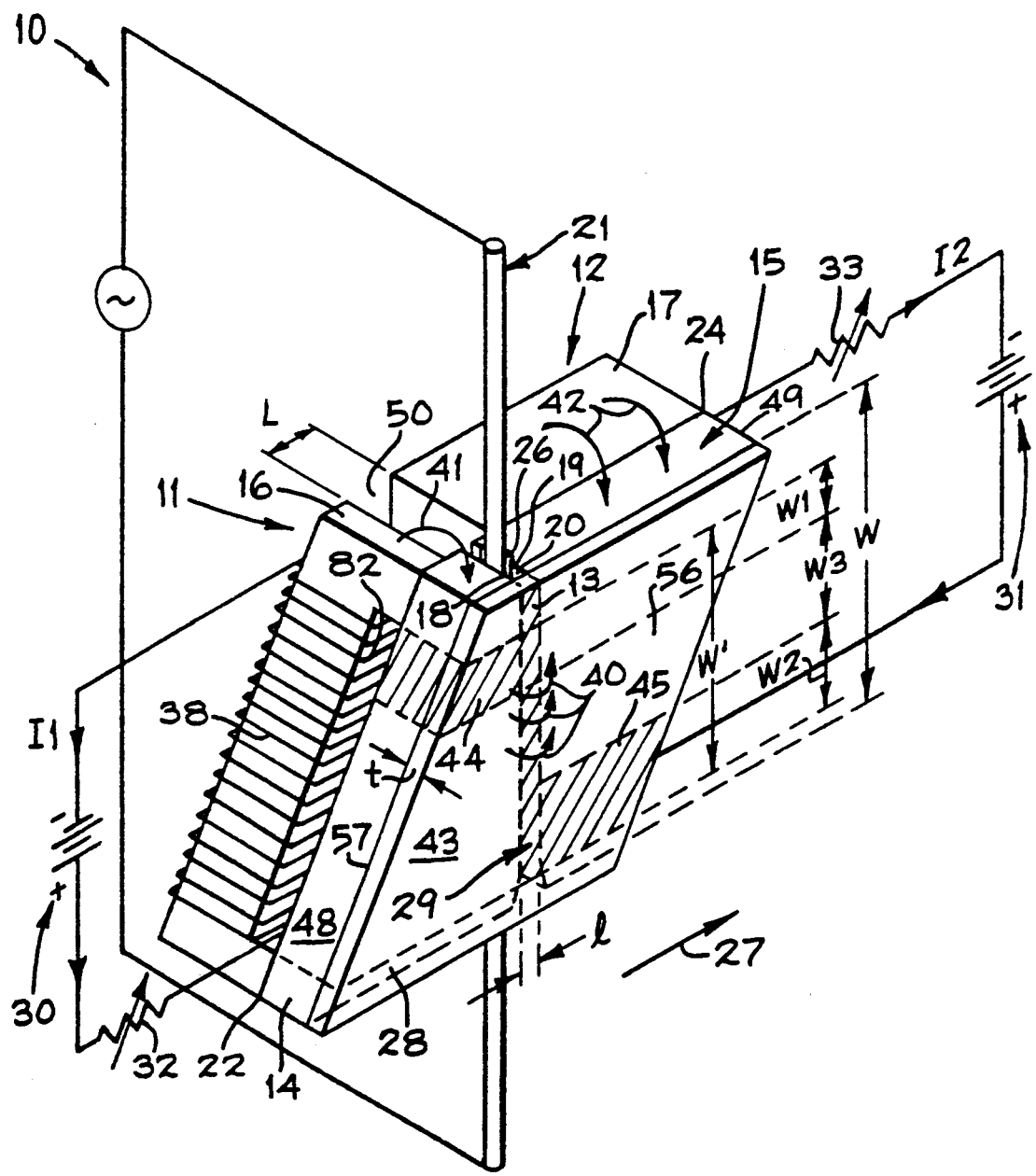
FIG_2

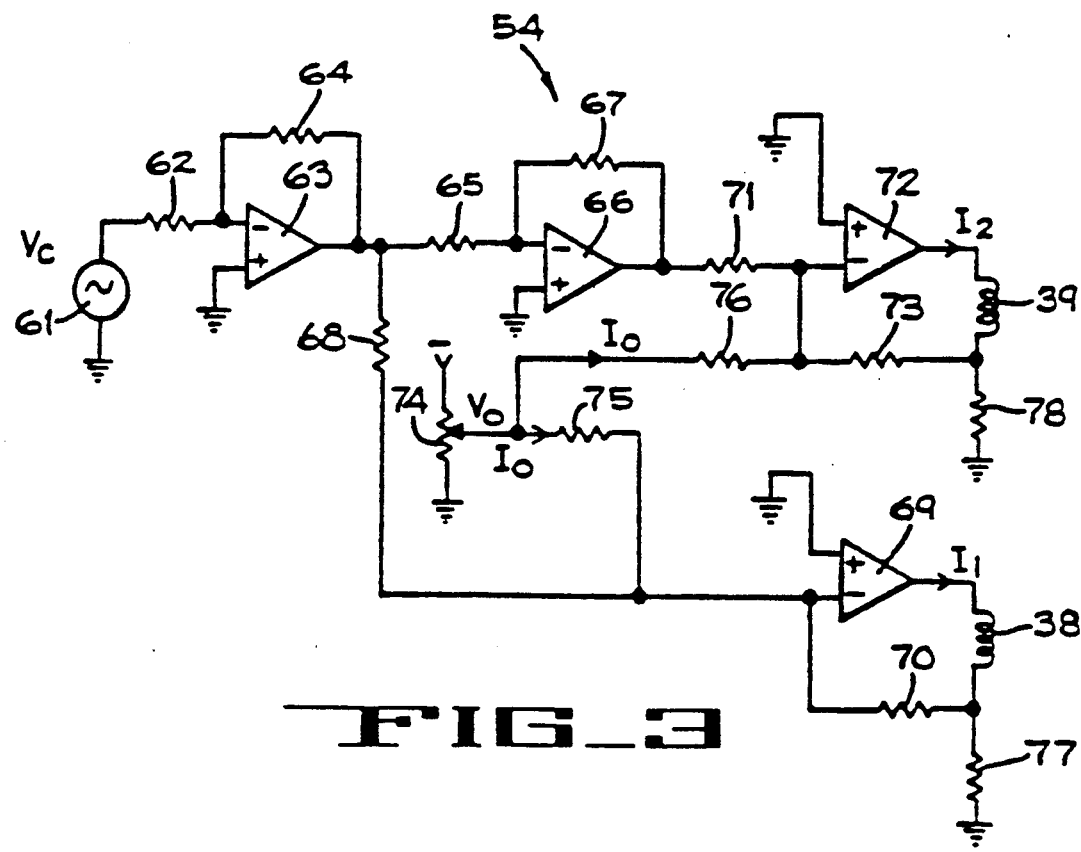
FIG_3
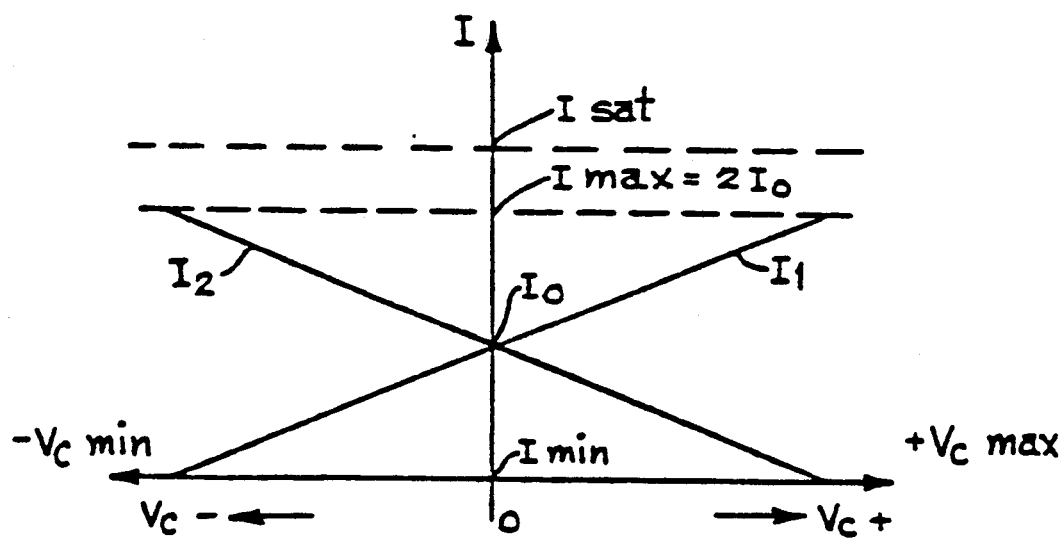
FIG_4

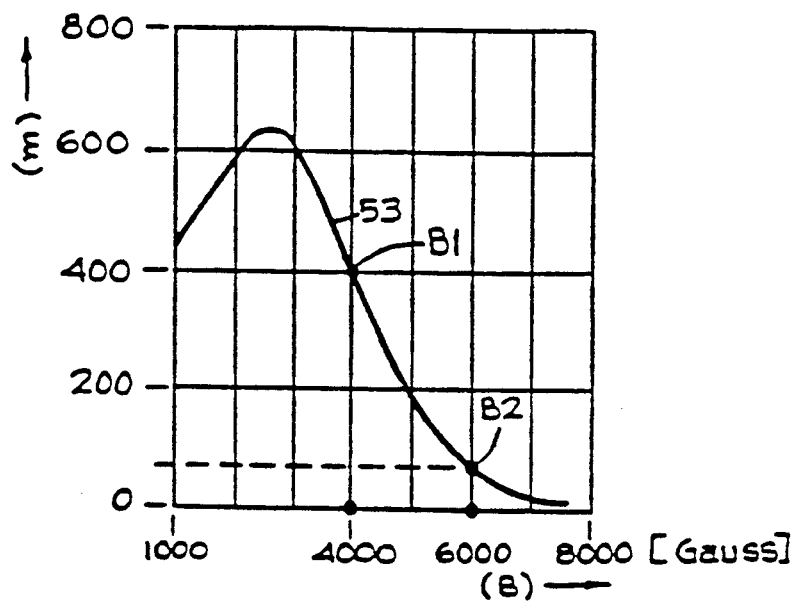
FIG_5
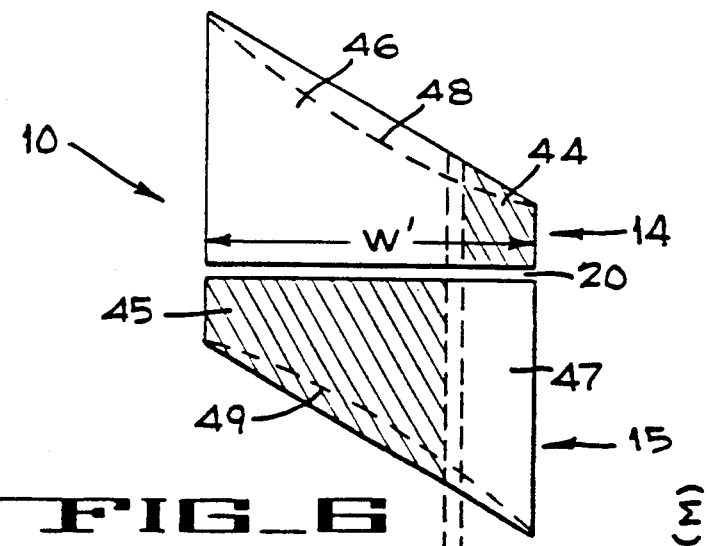
FIG_6
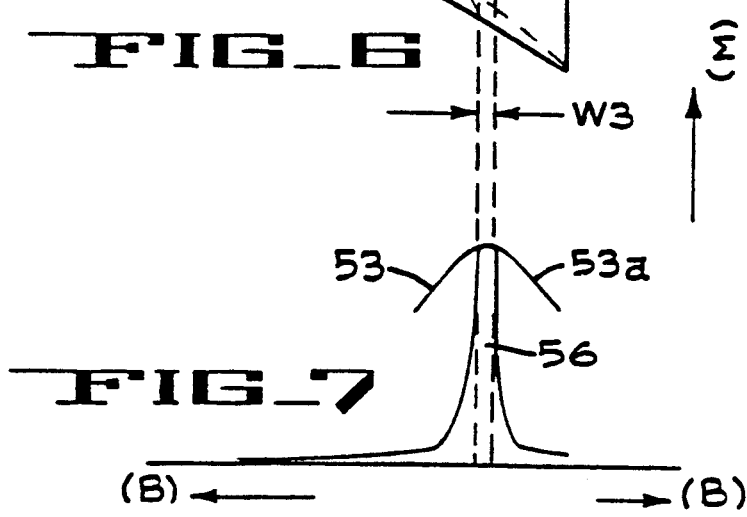
FIG_7

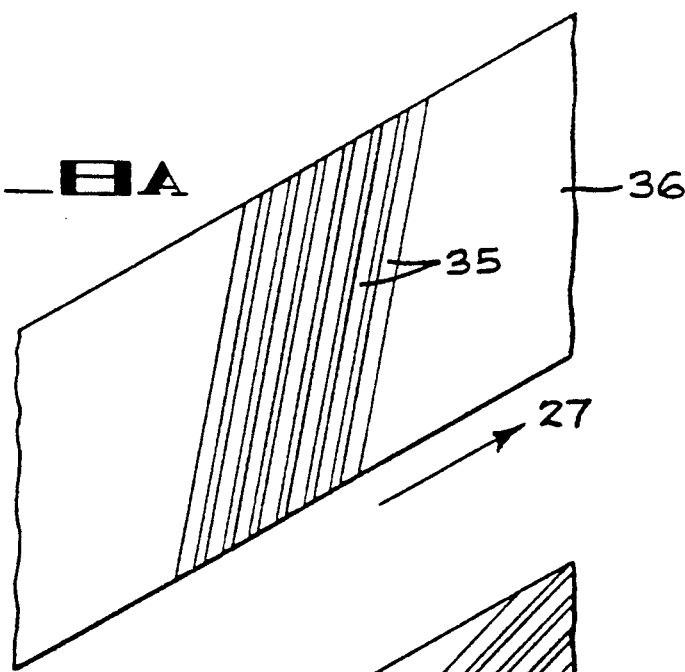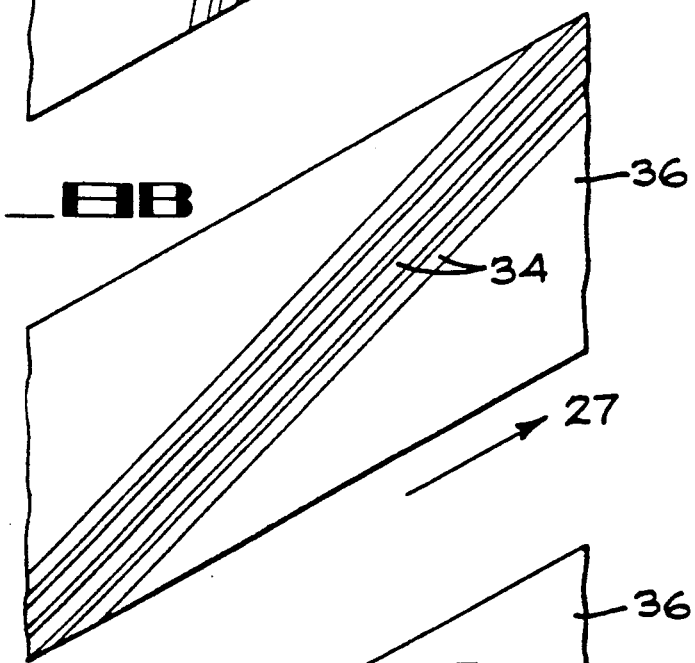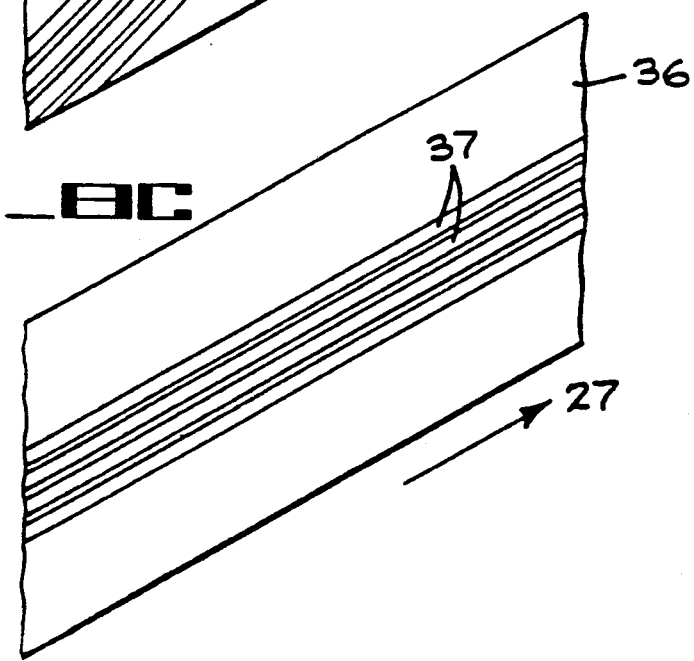

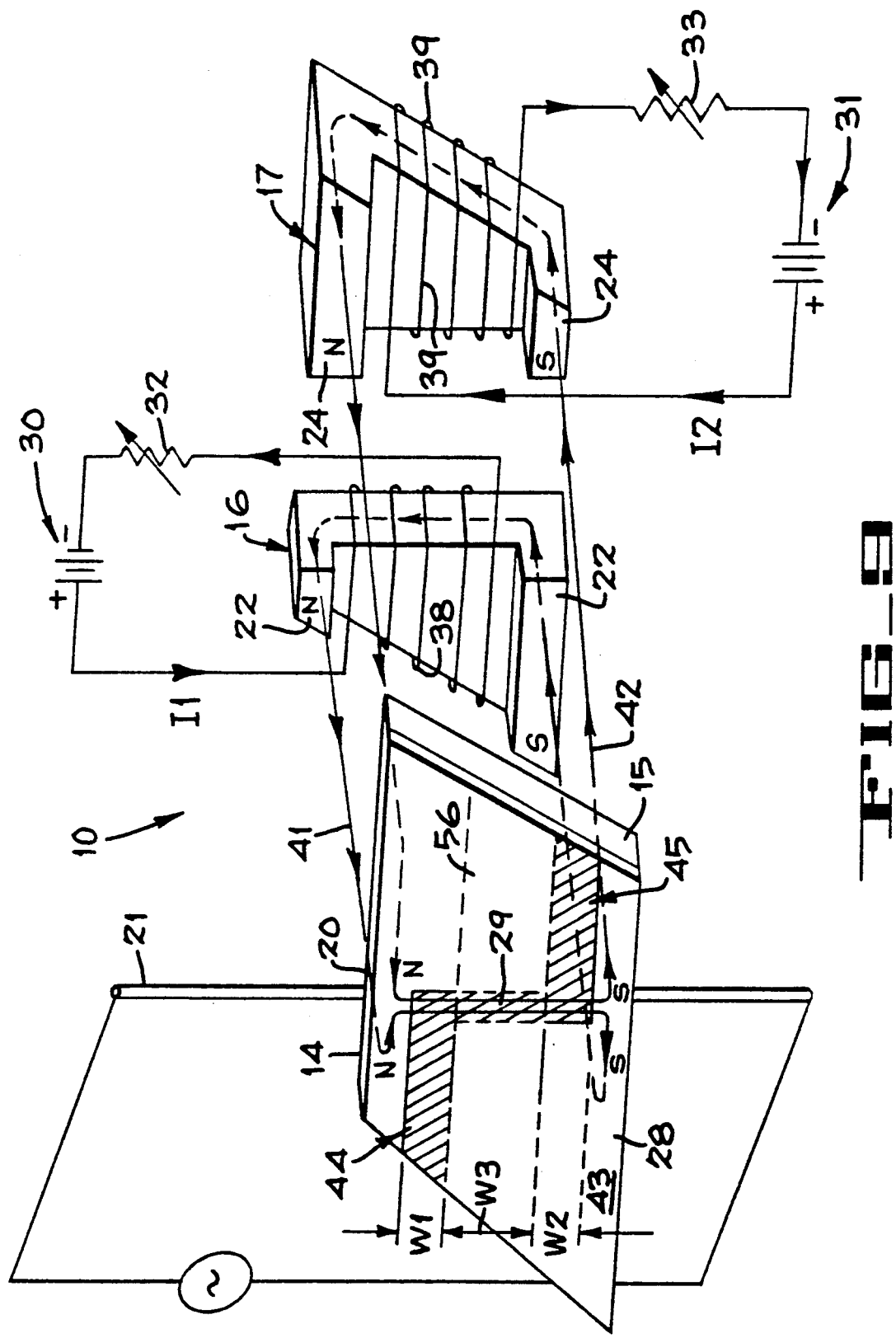

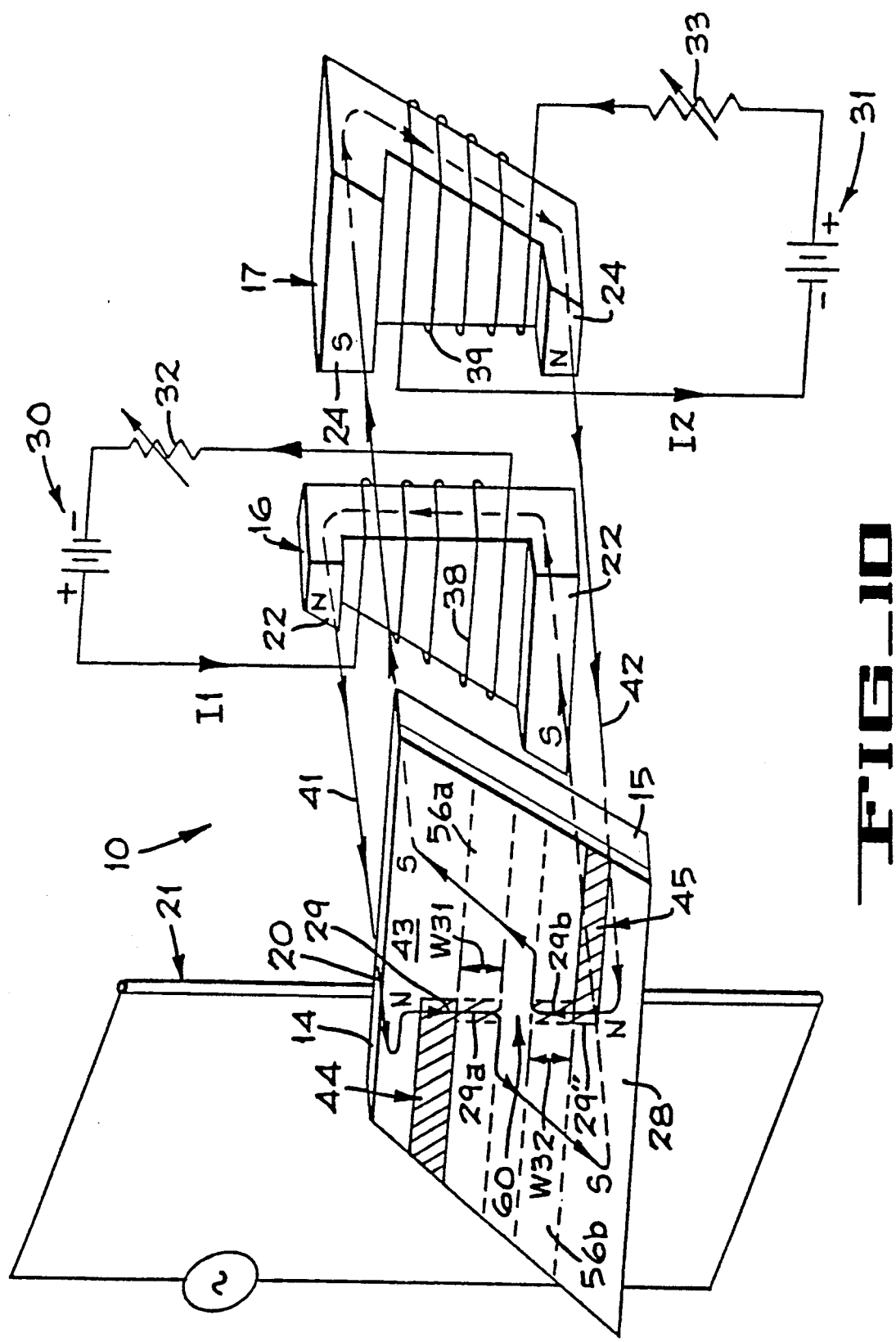

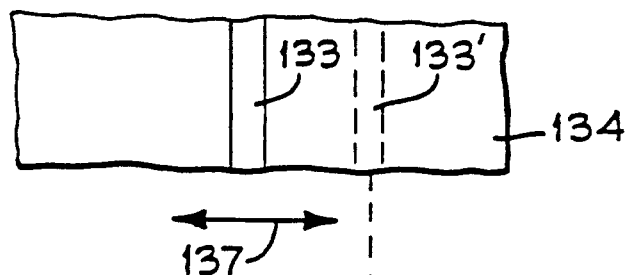
FIG_11A
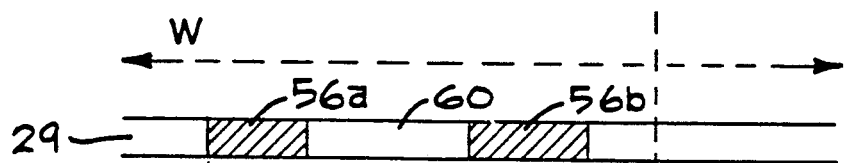
FIG_11B
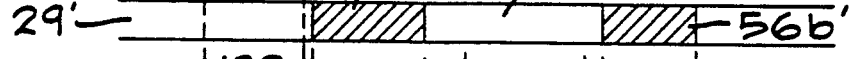
FIG_11C
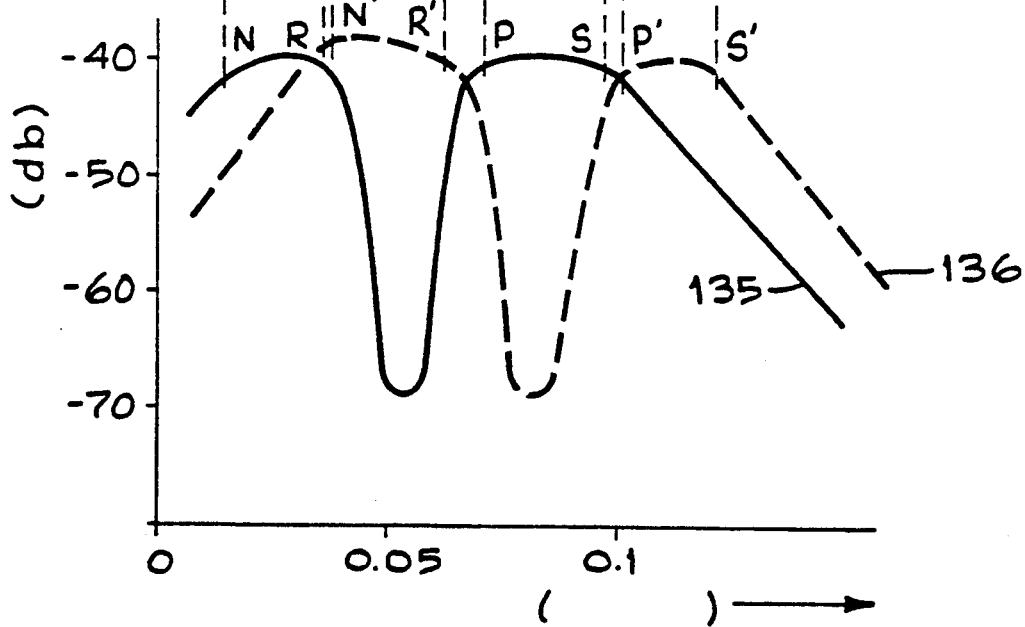
FIG_11D

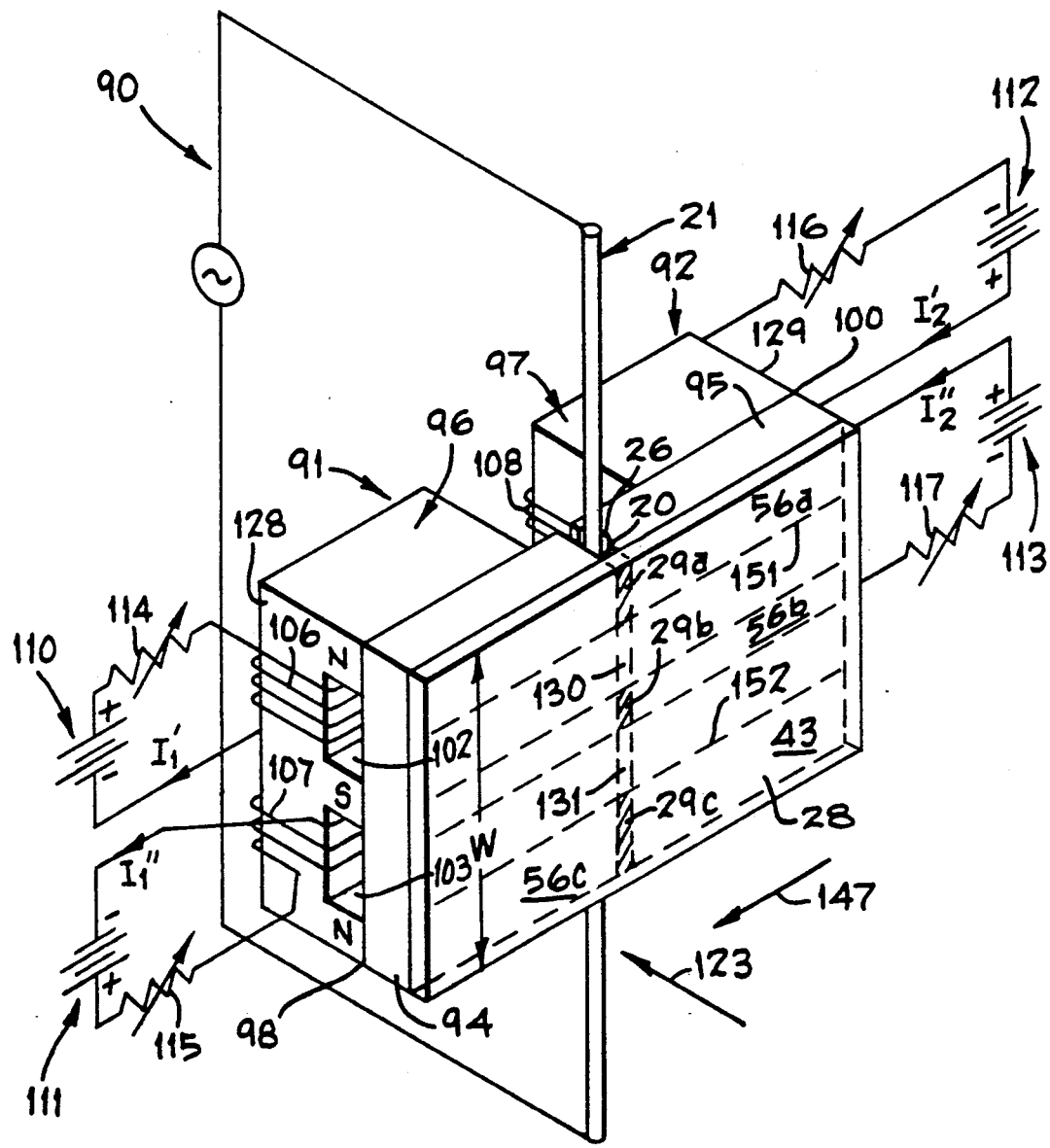
FIG_12

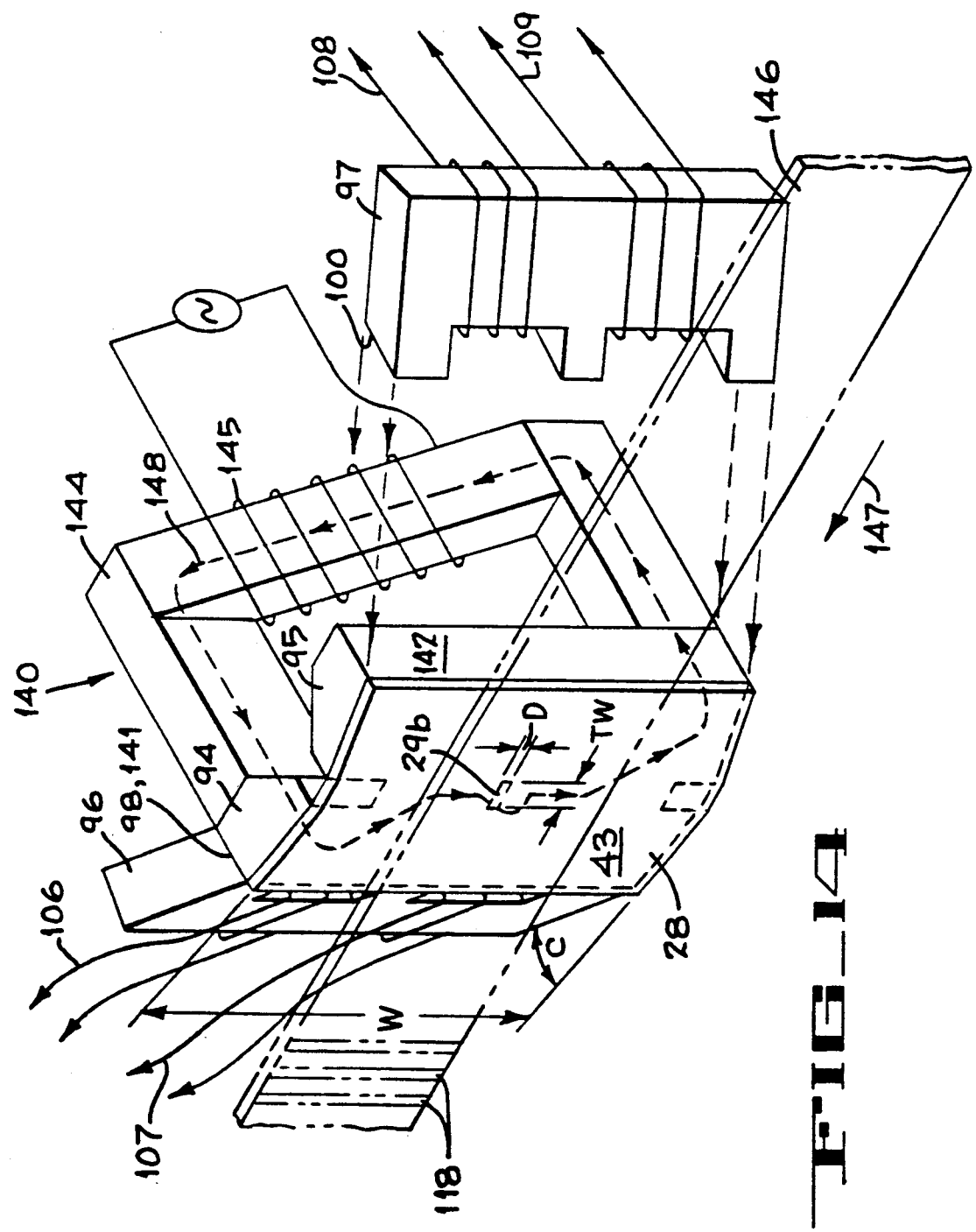

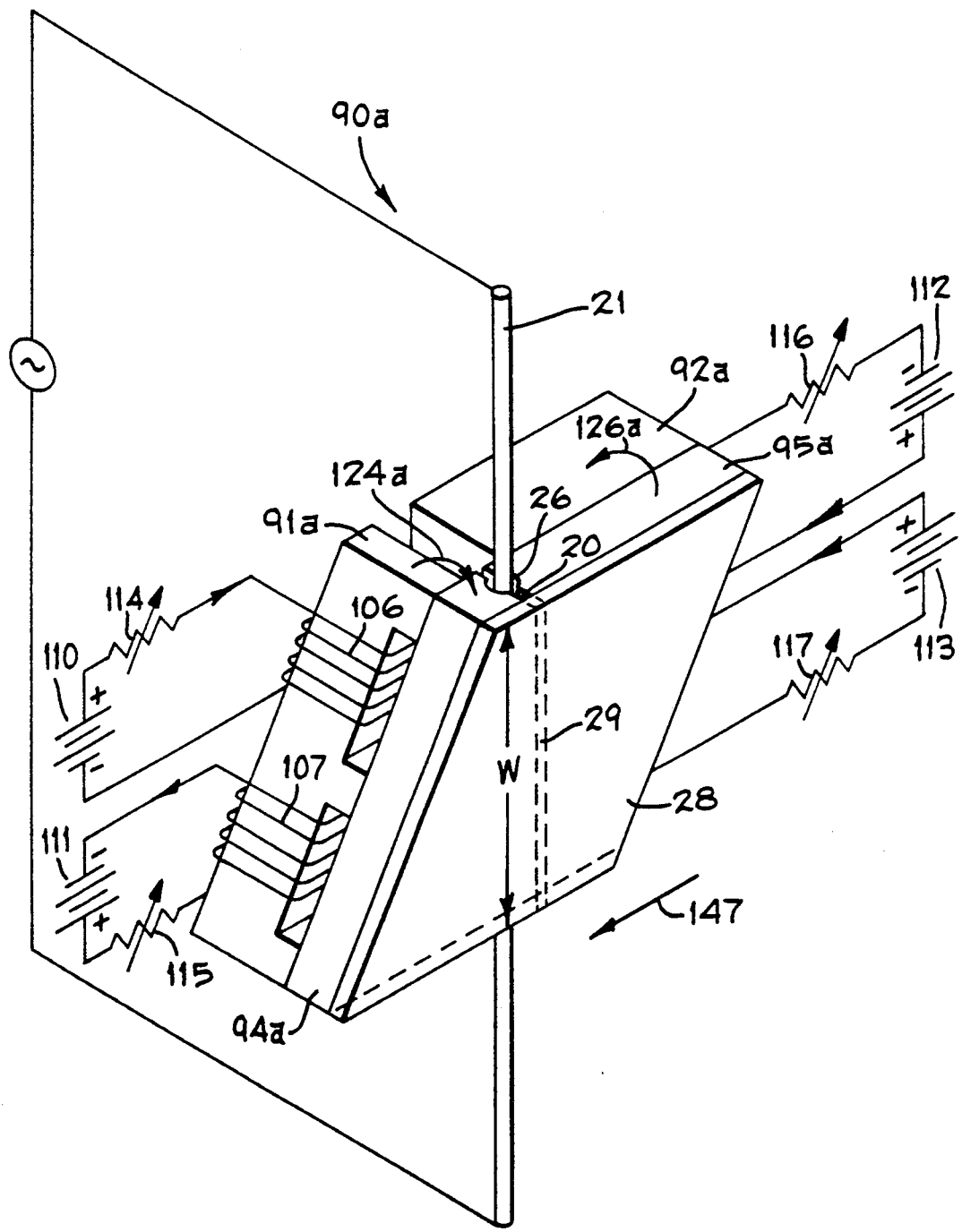
FIG_15

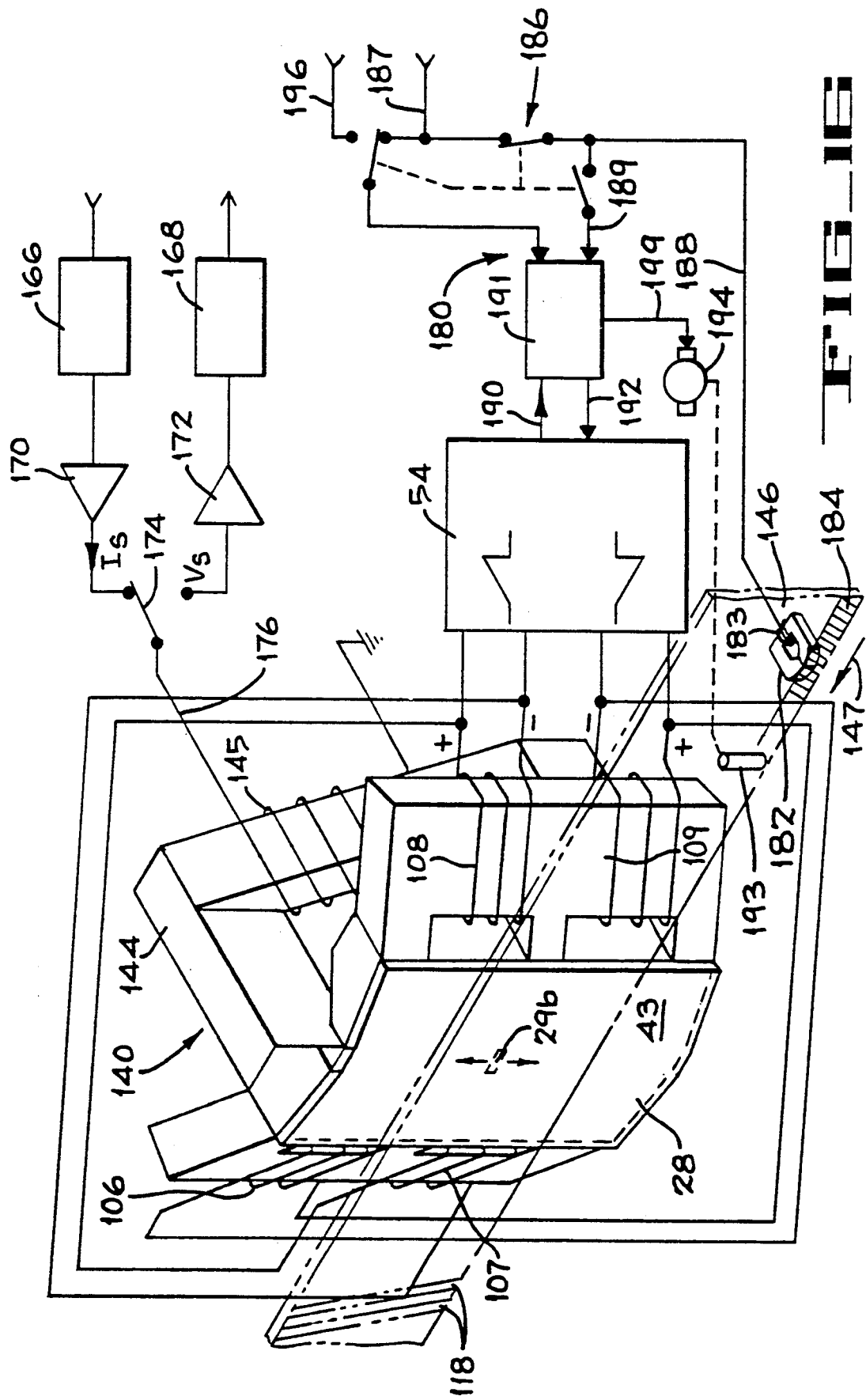
FIG_16

METHOD AND APPARATUS FOR TRANSFERRING INFORMATION BETWEEN TWO MAGNETIC BODIES USING A THIRD BODY OF MAGNETIC MATERIAL

This is a continuation-in-part of my following co-pending U.S. patent applications: Ser. No. 06/808,588 filed Dec. 13, 1985 and entitled METHOD AND APPARATUS FOR MAGNETIC TRANSDUCING (now abandoned); Ser. No. 06/715,211 filed Mar. 22, 1985 and entitled IMPROVEMENTS TO MAGNETICALLY CONTROLLED SCANNING HEADS (now abandoned); Ser. No. 06/808,924 filed Dec. 13, 1985 and entitled MAGNETIC TRANSDUCER HAVING SATURABLE KEEPER AND A RECORDING/REPRODUCING APPARATUS UTILIZING THE TRANSDUCER (now abandoned); Ser. No. 06/829,592 filed Feb. 13, 1986 entitled ELECTROMAGNETICALLY CONTROLLED SCANNING MAGNETIC TRANSDUCER; and Ser. No. 06/843,453 filed Mar. 24, 1986 entitled MAGNETICALLY CONTROLLED SCANNING MAGNETIC HEAD TRACKING CONTROL SYSTEM. U.S. patent application Ser. No. 06/808,588 in turn is a continuation-in-part of U.S. patent application Ser. No. 06/715,211. U.S. patent application Ser. Nos. 06/715,211 and 06/829,592 are themselves continuation-in-parts of U.S. patent application Ser. No. 06/641,817 filed Aug. 16, 1984 (now abandoned). U.S. patent application Ser. No. 06/843,453 is a continuation-in-part of the following U.S. patent applications: Ser. Nos. 06/829,592; 06/715,211; 06/808,588; and 06/808,924.

Cross-reference is hereby made to the following U.S. patent applications: United States National Application. Ser. No. 07/100,816 filed Aug. 6, 1987, which is based upon and entitled to the benefit of the effective filing date of Patent Cooperation Treaty Application No. PCT/U.S. 86/02732, entitled MAGNETIC RECORD MEDIUM HAVING DISCRETE MAGNETIC STORAGE AND SATURABLE LAYERS AND MAGNETIC SIGNAL PROCESSING APPARATUS AND METHOD USING THE MEDIUM filed concurrently herewith, abandoned in favor of continuation application Ser. No. 07/555,811 filed Jul. 23, 1990, now U.S. Pat. No. 5,041,922; and U.S. National Application Ser. No. 07/128,115 filed Aug. 6, 1987, which is based upon and entitled to the benefit of the effective filing date of Patent Cooperation Treaty Application, entitled METHOD AND APPARATUS USING A STATIONARY SATURABLE MEMBER FOR TRANSFERRING SIGNALS RELATIVE TO A MAGNETIC STORAGE MEDIUM filed concurrently herewith, now U.S. Pat. No. 4,985,795.

All of the above-identified patent applications are assigned to Ampex Corporation, assignee of this patent application.

This invention relates in general to magnetic recording and reproducing and, more particularly, to the provision of a body of magnetic material to provide a signal transfer or transducing zone for the transference of magnetically defined information between a signal utilization device and a magnetic storage medium. It more specifically relates to the control of the location of a signal transfer or transducing zone in such an additional body of magnetic material. (By "signal transfer zone" or "transducing zone" as used herein, is meant a zone responsible for coupling magnetic flux to or from the body having the zone). The preferred embodiments of the invention described here relate to the use of the physical transducing gap of an electromagnetic transducer to establish a transducing zone in a magnetically saturable body proximate the physical path of a magnetic storage medium. In certain of the preferred embodiments, the location in the body of the transducing zone is varied.

There are many instances in which it is desirable to transfer magnetically defined information between a magnetic storage medium and a signal utilization device using an electromagnetic transducer which converts the magnetic state definition of the information into an electrical definition of the same. An electromagnetic transducer typically has a body of high permeability magnetic material that is provided with a physical gap (generally referred to as a transducing gap) between two magnetic poles. This gap interrupts the flux path within the transducer to permit coupling of flux from and to the flux path. Flux is coupled from the flux path within the transducer to, for example, a magnetic storage medium by fringing from the body of magnetic material at the gap. The gap also enables the head to "pick-up" (detect) magnetic flux which fringes from a properly positioned magnetic storage medium. Signal means are provided to sense the picked-up flux flowing in the flux path and transmit the information defined by the magnetic flux to a desired signal utilization device. The signal means typically is an electrical coil positioned to detect changes in the flux threading the flux path and convert the magnetically defined information to a corresponding electrical signal. (It will be appreciated that although this detection is transfer of information in one direction, i.e., from a magnetic medium to a magnetic transducer or head, transfer in the other direction, i.e., from a magnetic head to a corresponding magnetic storage medium, is, broadly speaking, quite similar. The information is converted from an electrical signal manifestation to a magnetic state manifestation by passing an electrical signal defining the same through the coil which induces corresponding magnetic flux on the flux path within the head.) This technology is used in disc recorders that have rigid magnetic disc storage media. The electromagnetic transducer of such an arrangement is made to "fly" (be out-of-media contact) during a record/playback operation. The resulting space between the head and magnetic storage medium gives rise to the well-known wavelength dependent spacing losses. Moreover, the resulting space also adversely affects the efficiency of flux transfer therebetween.

In other data recorders, such as magnetic tape or flexible (or floppy) disc recorders, using the technology, the magnetic head usually is in contact with the medium during signal transfer operations. While spacing loss is not such a major problem in these recorders, head and medium wear can be significant in view of relative movement between the medium and contacting head. For example, in wideband magnetic signal recording/reproducing devices, a high relative transducer-to-storage medium speed is necessary for recording/reproducing high frequency signals with good quality resolution. In such devices, the heads and storage medium frequently wear out and must be replaced. In this connection, wear at the face of a head can be particularly deleterious.

Rotary scan magnetic tape recorders represent a significant development in increasing the relative head-to-tape speed. Here, the transducer rotates at high speed in contact with a relatively slowly advancing magnetic tape. There are two basic types of rotary scan recorders in common use, generally referred to as transverse and helical scan recorders, distinguished by the angle at which the transducer sweeps the tape. There are many problems associated with obtaining a desired accuracy and reproducibility of a signal recorded by rotary scan recorders. For instance, it is necessary to maintain very small mechanical tolerances between and at the rotating transducercarrying drum, the transducer structure and the location of the transducer on the drum. At the same time, it is necessary to accurately maintain the rotational speed of the transducer, hence, drum with respect to the speed at which the tape is transported past the rotating transducer.

In magnetic recorders utilizing magnetically controlled scanning transducers, the disadvantages associated with mechanically rotating the transducer can be eliminated. Such transducers can be held stationary, while high scanning speed is obtained by magnetically scanning the transducing zone across the width of the transducer and thereby across the recording medium. An example of one magnetically controlled scanning magnetic transducer relies upon selective magnetic saturation of a region of the body of magnetic material forming the transducer so that a selected portion of the body is capable of transferring signals to and from the recording medium. The location of such selected location is controlled by control currents applied to control windings operatively associated with the body of magnetic material.

As will become more apparent from the following, the invention is applicable to a wide variety of arrangements for transferring information definable by magnetic flux in a magnetic head and in a magnetic storage medium. Utilization of the same can provide reduction of transducer and medium wear, reduction of wavelength dependent spacing losses and/or enhancement of transducer efficiency. Moreover, the present invention can be advantageously implemented in magnetically or mechanically controlled scanning transducer arrangements while the advantages of scanning are retained.

The present invention grew out of several discoveries. For one, it was discovered that a transducing zone can be created within a body of magnetic material without the requirement of a physical gap. It further was found that if this body of magnetic material was located to be magnetically proximate a magnetic storage medium such transducing zone can be made responsible for the coupling of flux between the body and a magnetic storage medium. Moreover, it was found that the body can be used to couple magnetic flux on a flux path therewithin to another magnetic body, such as the core of an electromagnetic transducer. It further was discovered that the physical gap in a conventional magnetic head can be used, as will be described, to establish the transducing zone in the body. (As used herein, the phrase "magnetically proximate" means that the body of magnetic material is positioned relative to the proximate object or field so that flux coupling between the two occurs, assuming that saturation or some similar magnetic affect does not prevent coupling.)

Bodies of soft magnetic material are commonly placed over the ends of a permanent magnet to capture and provide a path for flux between the magnetic poles of the magnet. Such bodies are referred to as "keepers", and serve to protect permanent magnets against being demagnetized. The magnetic material typically used to make a core for a transducer has characteristics similar to those of a keeper. The body of magnetic material utilized in connection with the instant invention basically has the same characteristics as a keeper. In some embodiments of the present invention the body performs a keeper function as well as provides a transducing zone. It is preferred that the material of this body have high absolute permeability, low coercivity and low magnetic saturation density. Such a material is commonly designated a soft magnetic material and is to be contrasted with "hard" magnetic materials, i.e., materials having a high coercivity and magnetic saturation density such as those that magnetically store information.

It should be noted that the existence of the transducing zone can be transitory. That is, it is only important that there be a transducing zone at the time which it is necessary for the coupling of flux between the storage medium and the keeper. For example, if the transducing zone is provided by flux induced by an A.C. current, the flux density discontinuity responsible for the formation of the transducing zone will be cyclic in nature. If the transfer is from a magnetic storage medium, it is only necessary from a practical matter that the transducing zone be in existence when the recorded magnetic states to be detected are in coupling relation to the transducing zone. When changes in magnetic state which are closely spaced in time relative to one another are to be detected and the transducing zone is provided by flux induced by an A.C. current, it is desirable that the flux responsible for the transducing zone be induced by a current providing very fast transitions, such as can be obtained with a square wave form as opposed to a sinewave form. Moreover, in certain situations it may be desirable to control the coupling of flux between a transducer and a storage medium by controlling the existence in the keeper of the transducing zone. This can be achieved by switching off and on the flux that provides the transducing zone.

The transducing zone is formed in the keeper by creating in the same one or more significant magnetic discontinuities, i.e., areas of substantially different magnetic permeability, such as typically are provided in electromagnetic transducers by the inclusion of a physical transducing gap. A permeability gradient provides such discontinuity, and it is most desirable that there be a steep permeability gradient between the region of the body providing the transducing zone and adjacent regions. The nature of such gradient and a preferred manner of achieving the same will be described in more detail hereinafter. Such discontinuity is most simply provided in the body by having adjacent magnetically saturated and unsaturated regions. Moreover, a transducing zone can be easily generated and defined in the keeper through the cooperation of a physical gap in a conventional electromagnetic transducer and a source of magnetic bias flux. This source of bias flux can be associated solely with the transducer or solely associated with the keeper and, in some instances, associated with both of the same. Moreover the source of bias flux simply can be provided by the record signal flux passing through the keeper.

Thickness of the keeper is important in determining the performance of the keeper. The selection of the thickness of the keeper depends on its purpose and its location. For reproduce operations, for example, a well defined transducing zone is preferred, and for reproduction of short wavelength signals, one having a small length. Relatively thin keepers are best for such operations. In applications where head and medium wear avoidance is important, such as in contact record and/or reproduce devices, a thicker keeper is preferred. Moreover, the transducer-keeper-magnetic storage medium arrangement also can influence the keeper thickness. In any case, the thickness of the keeper is selected relative to potential flux therein to create the transducing zone at the location desired. For example, in arrangements in which the keeper engages the face of a magnetic core having a gap so as to physically bridge such gap and a predominant amount of the bias flux flows in the head as well as in the keeper, the keeper is selected to be thin with respect to the core adjacent the gap, and the keeper-core cross sectional area perpendicular to the bias flux path adjacent the gap is selected to be large, so the portion of the keeper which bridges the physical gap will have a high flux density, preferably one which saturates the region having the same. The permeability of the saturated regions is low, i.e., similar to nonmagnetic materials, while the permeability of the surrounding regions remains high. These regions cooperate to define a virtual transducing zone within the body.

In several preferred embodiments described here, the bias flux which defines the transducing zone in the keeper is provided by a direct current source coupled to a signal winding associated with the magnetic head of the transducer. The magnitude of the direct current is selected to effect magnetic saturation of a selected area of the keeper bridging the face of the magnetic head that includes the physical gap while leaving adjacent areas unsaturated. These areas define a zone in the keeper in the nature of a "virtual" gap. This electromagnetically formed virtual gap is utilized to form a transducing zone for signal recording and playback. The transducing zone extends in a direction through the keeper defined by a line extending between the magnetic head and the magnetic storage medium. Moreover, the transducing zone may be positioned, moved or scanned within the keeper by correspondingly moving the virtual gap in the keeper by mechanical means, such as by mechanically moving the head relative to the keeper, or by magnetic control means, that is, by changing magnetic flux densities within the keeper. Moreover, the shape or size of the transducing zone in the keeper can be controlled by appropriately controlling the shape and size of the boundary within the keeper between regions of significantly different permeabilities, e.g., between unsaturated and saturated portions of the keeper. For example, in one of the preferred embodiments described and claimed herein, the working dimensions of the transducing zone established in the keeper is controlled by controlling saturation within the keeper.

It will be further appreciated that the method and apparatus of the present invention can have the unique feature of not only providing a magnetically formed transducing zone, but also shunting undesirable flux fringing from the physical gap in a transducer head or storage medium, which may otherwise deleteriously affect desired magnetic state storage or flux transfer.

U.S. Pat. No. 5,041,922 describes a magnetic medium which has a thin, soft magnetic keeper layer as well as a hard magnetic layer for storing information signals.

As brought out in such patent, it is known to provide magnetic media for perpendicular magnetic recording and storage having a layer of a soft magnetic material in addition to a layer of hard magnetic material for storage. In the past, however, the main purpose of providing such layers of soft magnetic material is to include means to provide an undefined, highly permeable flux path for signal recording and reproduction flux. These layers have not provided a defined transducing zone, nor have means been provided to create the conditions in layers necessary for the formation of such a zone. Moreover, these layers typically have been intentionally designed to be unsaturable by being made thick relative to the expected flux density.

Copending patent applications Ser. Nos. 06/829,592, 06/715,211 and 06/843,453 describe the utilization of magnetic scanning of transducing zone locations. The method and apparatus of the present invention are particularly applicable to such scanning arrangements since, among other reasons, with the instant invention the transducing zone is not part of a physical gap. In several preferred embodiments described here, the location of the transducing zone in the keeper is moved at a relatively high speed by electromagnetic control means, that is, without the use of any mechanically moving control devices. A relatively slowly advancing magnetic storage medium, for example tape, is transported past the keeper body on a path which is in magnetic proximity thereto.

In the following detailed description, the method and apparatus of the present invention will be described with reference to specific embodiments thereof. However, it will be appreciated that the keeper body may be utilized in combination with signal utilization devices and magnetic storage media in general, and therefore the invention is not limited to the described embodiments.

With reference to the accompanying drawings:

FIGS. 1A, 1B, 1C, 1D and 1E illustrate the principles of the invention;

FIG. 2 is a schematic perspective view of a preferred embodiment of the present invention;

FIG. 3 is a schematic diagram of a control circuit utilized to drive the transducer of the embodiment of FIG. 2;

FIG. 4 is a control voltage versus control current characteristic obtained by the circuit of FIG. 3;

FIG. 5 is an example of a flux density versus permeability characteristic of a well known magnetic material;

FIG. 6 shows a front elevation view of two confronting front cores of the transducer of FIG. 2 rotated by 90 degrees;

FIG. 7 shows two superposed flux density versus permeability characteristics of FIG. 5, each corresponding to one front core shown in FIG. 6;

Figure 13:
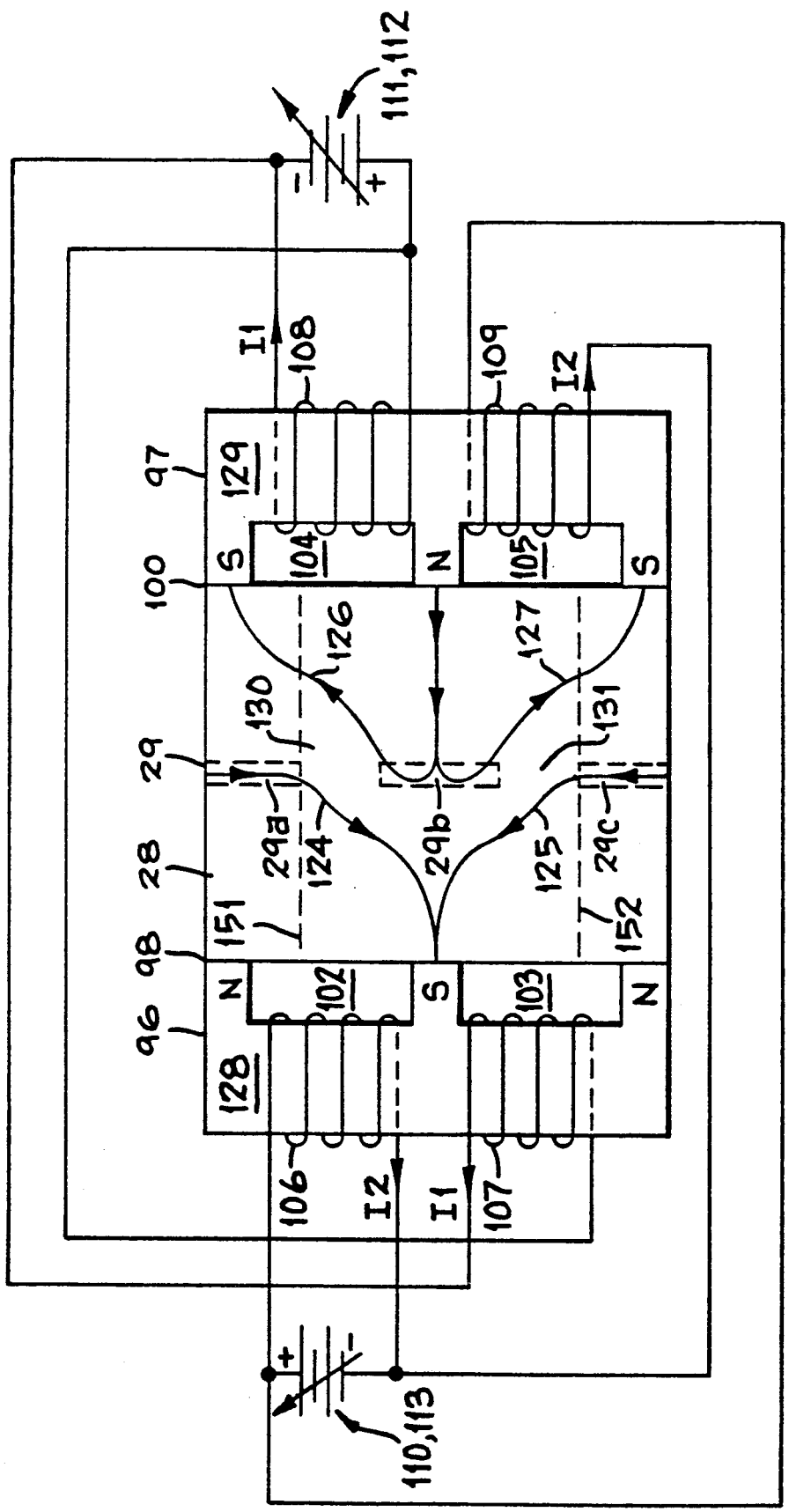

FIGS. 8A to 8C respectively shown various forms of recording which can be obtained when utilizing the apparatus of the present invention;

FIGS. 9 and 10 are exploded schematic perspective views of the embodiment of FIG. 2 depicting different orientations of control current;

FIGS. 11A to 11D show respective track profile characteristics obtained by measuring;

FIG. 12 is a schematic perspective view of another embodiment of the invention;

FIG. 13 is a schematic representation of control currents and resulting flux paths in the keeper of the apparatus of FIG. 12;

FIG. 14 is a partially exploded schematic view of a still further embodiment of the invention;

FIG. 15 is a schematic perspective view of an alternative embodiment to that of FIG. 12; and FIG. 16 is a schematic diagram of an apparatus utilizing an embodiment of the invention for recording/reproducing on parallel tracks of a storage medium.

In the following description and drawings, like elements will be designated by like reference numerals to facilitate comparison between various embodiments. The description of similar elements and circuit portions illustrated in more than one figure of the drawings may not be repeated with reference to each of the figures.

Principles of the invention can best be understood with reference to FIGS. 1A-1E. FIGS. 1A and 1B are basically the same, except for the showing of the physical location of a keeper body of material relative to a core of an electromagnetic transducer and magnetic storage medium. With reference to such figures, an electromagnetic transducer is generally referred to by the reference numeral 1. Such transducer includes a body 2 of magnetic material, commonly referred to as a core, defining a pair of magnetic poles 3 that form therebetween in accordance with conventional practice, a physical gap 4 of the type used to cause magnetic signal transfer.

Transducer core 2 is positioned to interact with a magnetic storage medium represented at 5 to transfer information therebetween. (Such storage medium can be, for example, a thin layer of hard magnetic material forming a magnetic tape or disc. It should be understood that the storage medium commonly is combined with a non-magnetic substrate and in many instances other materials.) Storage medium 5 is a magnetic layer which is deposited on a substrate 252. The combination of the magnetic layer 5 with the substrate 252 forms a record medium 253.

In accordance with conventional practice, transducer 1 includes a signal winding 6 that delivers to and/or receives from the magnetic core 2, information in the form of an electrical signal that is converted to or from a magnetically definable characteristic. The information is definable by magnetic flux on a flux path 259 defined by core 2, and the signal winding 6 is positioned relative to the core to detect magnetic flux on a portion of such path. If the transducer is reproducing information from the storage medium 5, magnetic flux emanating from the storage medium and coupled to the path 259 can induce an electrical signal or signal component in the winding 6. On the other hand, if transducer 1 is being used to record information, an electrical signal or signal component in the winding and defining the information, can induce corresponding flux along the path 259 within the core 2.

The circuitry included in outline block 7 provides a schematic representation of the means by which an electrical signal is communicated between the transducer and a utilization device. That is, winding 6 is connected between ground represented at 211 and a D.C. blocking filter represented by a capacitor 212. The other side of capacitor 212 is connected via a switch 213, which for reproducing information recorded on the storage medium 5, couples the capacitor to the input of a reproduce amplifier 214, the output of which is connected to a signal utilization device as represented at 216. Thus, if a signal is induced in winding 6 by flux on the path 259, a corresponding signal representing the information will be fed to the utilization device. If the transducer-keeper combination is used to record information, switch 213 is positioned to connect the capacitor 212 to a record amplifier 217 to receive electrical current from a source 218 defining the information to be recorded. Such signals typically are A.C. signals which are passed by the capacitance filter 212 to coil 6. A.C. current flow in such coil will result in a corresponding change in the flux on the flux path 259 within the core 2.

In a conventional arrangement, the magnetic coupling between the magnetic storage medium 5 and the transducer 1 is provided by the physical gap 4 defined between the opposing poles 3 of the transducer 1. For example, in a playback arrangement of a saturated recording arrangement, regions within a magnetic storage medium having oppositely directed magnetism defining information indicia are passed along a path in magnetic proximity to the gap 4. Oppositely directed flux fringe from these storage regions and are coupled by the gap 4 into the core 2 of the transducer. This flux changes the magnetic flux which interacts with the winding 6 and thus induces current flow therewithin.

In keeping with the invention, a body of magnetic material having characteristics of a keeper is provided as an intermediary between the magnetic storage medium 5 and the transducer core 2. Such body of material is schematically illustrated in FIGS. 1A-1E and is designated by the reference numeral 8. It is positioned magnetically proximate both the magnetic core and the location for the magnetic storage medium 5. In this connection, it will be noted that in FIG. 1B, the intermediary body 8 is not physically located between the core 2 and magnetic storage medium 5. The physical location of the intermediary body can depend on many factors. If its purpose is to prevent head wear because of relative movement between the storage medium 5 and the magnetic head 1, it most desirably is positioned between the head and the medium, as in FIG. 1A. Moreover, it simply can be a coating provided by vacuum deposition or the like on either the transducer face across the gap or on the storage medium. That is, insofar as the principles of the invention are concerned it need not be separated physically from the head or the medium. In fact, to reduce spacing losses in many instances it is desirable that it be physically close to the storage medium 5, and most preferably, physically in contact with the storage medium 5 of the record medium 253. Intimate contact resulting from a deposition process provides the best results insofar as reduction of spacing loss is of concern.

It has been found that a transducing zone 9 can be formed in the body 8 to effect coupling of magnetic flux into such body. Thus, when the body is positioned as aforesaid magnetically proximate both the core 2 of the magnetic transducer and the location of a magnetic storage medium 5, it acts in effect as an intermediary which conveys information defined by flux in the storage medium to the core, or vice versa.

The transducing zone 9 preferably is formed by providing different regions of the body with significant differences in permeability. It is desirable to have a steep permeability gradient between such regions. This significant permeability difference is most simply achieved by magnetically saturating a region of the keeper body 8. This is implemented in the embodiments of FIGS. 1A-1E by magnetically saturating a region of the keeper corresponding to the physical transducer gap 4. Such saturation can be provided by separate bias magnetic flux or, in a recording operation, by the use of the actual recording signal flux.

Most desirably, means are included to provide a bias magnetic flux in the body to create the desired transducing zone. While such a flux bias can be achieved in various ways, e.g., with the use of permanent magnetism as will be described, it further has been found that such a flux bias simply can be created by applying a D.C. or A.C. voltage to the winding 6. The winding 6 and the circuitry otherwise associated with the transducer 1 therefore is used for this purpose. In the embodiment of FIG. 1A, a D.C. voltage source represented at 221 is connected to the winding 6. A variable resistance 219 is illustrated connected between the winding and the source 221 to allow the current provided by the D.C. source to be adjusted. It is adjusted to assure there is sufficient flux emanating from the head 1 at the gap 4 to saturate the transducing zone 9 within the keeper 8. The primary purpose of the filter 212 is to isolate the bias current provided by the D.C. source 221 from the signal record and reproduce circuitry, and thereby prevent undesirable interference with the record and/or reproduce signal information. If an A.C. bias is used, appropriate filters, such as frequency filters, are most desirably included in the bias and signal circuit paths to keep such circuits isolated from one another.

The reluctance provided by the keeper 8 to the passage of magnetic flux along a path that shunts the transducer 1 is selected relative to the reluctance for such flux along a path extending through the transducer to assure a desired transmission of information. The relative reluctances are achieved through the selection of appropriate combinations of various characteristics, such as materials, thickness of materials, size of area of transducer pole faces 222, size of area of saturated keeper region 9 in a plane perpendicular to the face 222 of the transducer 1, thickness of the keeper 8, distance (if any) separating the transducer 1 and the keeper 8 of the record medium 253, and the length, width and depth, of physical gap 4.

FIG. 1A illustrates an arrangement in which the keeper 8 is physically located between the transducer 1 and the storage medium 5. The path of bias flux created by D.C. current coupled to the winding 6, is represented by solid line 223. This flux path extends through the face 222 of the transducer 1 into the keeper 8. Because of the aforementioned various characteristics, the keeper magnetically saturates first proximate the location of the physical gap 4 before other places in the magnetic circuit defined by the transducer 1, keeper 8 and storage medium 5, with the result that the saturated transducing zone 9 will be created. (It should be noted that the material of the storage medium 5 is selected to have a significantly higher coercivity and magnetic saturation density than the keeper or transducer core so as to avoid saturation of the same at the bias flux intensities.)

The path for signal flux induced within the magnetic core 2 by the winding 6 is magnetically proximate to the winding as is necessary to have signal flux generated within the head 1 during recording or to induce a voltage in the winding 6 during reproduction. In this connection, it will be apparent that in this embodiment in which the coil 6 is used both to generate the bias flux and to generate or pick-up the signal flux, the paths for the two fluxes within the interior of the head will be the same, at least along that portion which threads through the winding 6. Thus, although for ease and description separate flux paths 223 for the control flux and 224 for the signal flux, as well as a common path 259 is illustrated in FIG. 1A, the paths essentially will be the same. Because of the transducing zone 9, during recording signal flux from the head is diverted to the storage medium as represented by path 224. During reproduction, flux from the storage medium 5 is diverted by reason of the existence of the transducing zone 9 onto the path 224 within the head for signal flux.

It will be noted that the keeper 8 is in direct contact with the magnetic storage medium 5 of the record medium 253 in the embodiments of FIGS. 1A, 1B, 1C and 1E. This assures that the transducing zone is as close as practical to the storage medium to reduce spacing losses. In this connection, it should be noted that spacing losses are due to space between a magnetic storage medium and the transducing zone where coupling between the medium and the transducing zone occurs through the action of fringing flux, either from a physical gap 4 in a transducer during recording operations, or from recorded magnetic states in the magnetic storage medium during reproducing operations. In accordance with the present invention, placing the highly permeable keeper 8 in contact with the magnetic storage medium 5 provides a low reluctance path for flux that would otherwise fringe from either the cores 2 of the transducer 1 or the medium 5, as the case may be, and directs such flux along a path between the transducer and medium that is not wavelength dependent, and thereby enable elimination of the undesirable spacing loss effect of any non-magnetic separation between the transducer and medium. Thus, an advantage of the invention is that it enables the spacing responsible for spacing losses essentially to be eliminated even though there might be a necessity of some space between a transducer core and a record medium because of relative motion between the two. This is particularly important in playback operations, where the effects of spacing loss cannot be easily overcome as in recording operations by increasing the recording power. Furthermore, with a keeper 8 in contact with a rigid magnetic medium 5, such as a magnetic disc, the transducer 1 can be located out of contact with the medium 5 during playback operations without suffering deleterious playback spacing loss. If playback spacing losses are not a problem, the keeper could be separated from the medium. Regardless of whether or not the keeper 8 is in contact with the storage medium 5, the flux path generally will be the same. This is true even if the keeper 8 is not in physical contact with either the storage medium 5 or core 2, or is in physical contact with only the core of the transducer. Locating the keeper 8 between the magnetic storage medium 5 and the core 2 is preferred in those instances in which it is desired to physically separate the medium and core, such as when it is desired to prevent head and/or medium wear due to relative motion between the two.

In embodiments of the present invention constructed in accordance with FIG. 1A, a keeper body or layer 8 of permalloy having a thickness in the range of about 300 to 1000 Angstroms was deposited on a cobalt-phosphorus electroless plated magnetic storage medium 5 having a thickness in the range of about 700 to 1500 Angstroms. The thusly deposited keeper layer 8 had a magnetic coercivity of less than one, whereas the magnetic storage medium 5 had a coercivity of about 1000. The magnetic permeability of the keeper layer was in the range of 1000 to 2000 in the unsaturated regions. In the saturated region of the transducing zone 9, the permeability was in the range from that approaching 1 to about 100. For optimum efficiency, the permeability difference between the adjacent saturated and unsaturated regions of the transducing zone 9 should be as large as practicable. However, a 10:1 ratio of unsaturated-to-saturated permeability will enable transfers of signal information between the transducer 1 and the magnetic storage medium 5.

FIG. 1B illustrates an embodiment in which the keeper is physically separated from the transducer core 2 by the magnetic storage medium 5. Such an arrangement is particularly desirable when it is important to reduce playback spacing losses although physical space is required between the transducer core, such as core 2, and the magnetic storage medium. The bias flux follows the path represented by the solid line 223 through the keeper. The signal flux is represented by the dotted line 224. The physical location of the keeper relative to the magnetic medium illustrated in FIG. 1B is similar to FIG. 1A in that the transducing zone 9 is in contact with the storage medium 5. The above discussed reduction in spacing losses is achieved in this embodiment because the keeper 8 attracts and directs flux from the magnetic storage medium 5 to the transducer core 2 in the same manner as previously discussed.

In the embodiment of FIG. 1B, the keeper 8 is illustrated as a layer separating the magnetic storage medium 5 from a backing or substrate 252 for the medium. From the broad standpoint, however, the keeper 8 also could be a separate piece placed on the side of the substrate 252 opposite the transducer 1. However, the separation of the keeper 8 and the magnetic storage medium 5 that results from such placement is at the sacrifice of spacing loss.

FIGS. 1C and 1D illustrate the use of a permanent magnet as represented at 264 to form the desired transducing zone 9 in the keeper 8. While the embodiment of FIG. 1C is quite similar to that of FIG. 1A, it should be noted that the circuitry provided in FIG. 1A to furnish the D.C. bias current in the winding 6 and thus create the transducing zone is eliminated, in favor of the permanent magnet 264. The magnetic strength, the shape of the magnet 264 relative to the shape of the keeper 8 and of the magnetic core 2 proximate such magnet, and the spacing between the magnet 264 and the core 2, should be such that flux produced by the same in the keeper 8 will saturate a region to form the transducing zone 9. The criteria for selecting material for the keeper when a permanent magnet is utilized are the same as discussed above. FIG. 1D is a schematic, partially sectioned view illustrating that the magnet 264 is spaced from the poles 3 of the transducer core 2 to assure that such core will not cause a magnetic short in the magnet. The purpose of including FIGS. 1C and 1D is simply to make clear that the invention is not limited to arrangements in which the permeability difference such as provided by a magnetically saturated region in the keeper 8 is formed by an electrically induced magnetic field.

The invention is also not limited to arrangements in which the path of the bias control flux extends through the magnetic transducer 1. FIG. 1E illustrates an arrangement in which the bias control flux has only a minimal path in the core 2. In an arrangement in which the transducing zone 9 in the keeper is caused by the physical gap 4 in a magnetic core 2, the flux defining such a zone only has to flow in the core adjacent the physical gap to the extent needed to provide saturation in the keeper. Such flux follows a path represented at 223 in FIG. 1E, whereas the signal flux will follow the path represented at 224 between the winding and the magnetic storage medium.

It will be recognized from the above that the transducing zone 9 can be formed in the keeper 8 via bias control flux without significant path in the magnetic transducer 1. The path of bias control flux may be in the head as described in connection with the earlier embodiments, may be within the keeper, or divided between the head and the keeper. Moreover, sufficient magnetic discontinuity may be formed in the keeper to form a transducing zone therein from other types of energy source, such as a thermal one.

The principles of the invention will be better understood and appreciated by reference to the specific implementation of the same in the embodiments of the invention described below.

Referring now to FIG. 2, transducer 10 has two confronting cores 11, 12 made of a magnetic material, for example ferrite. The cores 11 and 12 define a magnetic head and each has a front core 14, 15 and a back core 16, 17 abutting respectively at confronting surfaces 22 and 24. The front cores 14, 15 are made in the form of oppositely oriented wedge sections, confronting at a gap plane 13. The oppositely oriented wedge sections of the confronting cores 11, 12 have cross sectional areas gradually increasing in opposite directions across the width, W, of the transducer 10.

The confronting front cores 14, 15 are preferably smoothly lapped and polished at the gap plane 13 to obtain faces to provide confronting magnetic pole faces 18, 19. A winding window 26 is provided in a well known manner in one or both front cores 14, 15 across the width, W, of transducer 10 to accomodate a transducing signal winding 21. Winding 21 is shown as a single turn winding as an example in the form of a conductive rod. Hpwever, a conventional multiturn winding may be ultilized instead. To keep signal flux losses at a minimum, it is preferable to provide the signal winding 21 closer to the keeper 28 than to the lateral surfaces 22, 24 opposite the keeper.

A suitable non-magnetic material is placed between the pole faces 18, 19 to obtain a gap 20, utilizing conventional transducing gap forming techniques. For example, a layer of silicon dioxide or glass may be deposited on the confronting surfaces 18, 19, which surfaces then may be bonded together in a well known manner. Further references to gap 20 will be as a "physical" gap to better distinguish it from an electromagnetically formed "virtual" gap of the keeper 28 of this embodiment as will be described below in detail. The length, l, of the physical gap 20 as shown is greatly exaggerated.

In the embodiment shown in FIG. 2, respective grooves 82 are provided in the back cores 16, 17 inwardly of the lateral surfaces 22, 24. Groves 82 serve to accommodate the bias control windings 38, 39 of each back cores 16, 17, respectively, of which control winding 39 is shown in FIGS. 9 and 10. By placing the control windings 38, 39 in recesses provided by grooves 82, the confronting lateral surfaces of the front and back cores at 22 and 24 are in intimate contact with each other. Air gaps between the front and back cores are thereby substantially eliminated while a desired tight, low reluctance magnetic coupling between these cores is obtained. Alternatively, other back core designs may be provided, which differ from that shown in FIG. 2, for example as described and shown in my above-identified copending application Ser. No. 06/751,211.

A keeper 28 of magnetic material is arranged over front surfaces 57 of the front cores 14, 15 in direct contact therewith and bridging the physical gap 20. As described hereinbefore, the keeper 28 is preferably made of a magnetic material having a substantially square hysteresis loop, that is, low coercivity and high permeability values with a magnetic saturation density substantially less than that of the magnetic storage medium with which it is to be used, such as permalloy, Sendust, ferrite or amorphous metal. Such keeper 28 is desirably formed by being deposited by vacuum sputtering or plating directly on the surface 57 of front cores 14, 15 utilizing well known material deposition techniques. While the front surface 43 the medium interface area, is shown in FIG. 2 as being generally flat, it may be contoured, if desired, utilizing well known contouring techniques. It is understood that both the transducer 10 and keeper 28 will assume the contoured shape.

The keeper 28 preferably has a very small thickness, t, in the direction of the depth of gap 20 so as to have a small cross-sectional area at such gap for saturation by bias flux as will be described. When constructed for use with common record media, this thickness is preferably between 0.00025 and 0.002 inch. The thickness of the keeper 28 also influences the length, l, of the transducing zone 56. Moreover, keepers of greater thickness require more bias flux to establish the desired transducing zone. For recording operations, a well defined transducing zone of small dimension, l, is not as critical as for playback operations, because recording in the magnetic storage medium is primarily determined by the magnetic state occurrences at the trailing edge of the transducing zone 56; i.e., the edge of the transducing zone last able to influence the recording on the medium during relative motion between the transducer and the medium, for example, as when the medium is transported past the transducer 10 in the direction indicated by arrow 27. For playback operations, however, a well defined transducing zone 56 with a small dimension, l, is preferred. In any event, to achieve the advantages of reduced spacing loss, the thickness of the keeper 28 and the strength of magnetic field bias for establishing the transducing zone 56 should be selected so that the length, l, of the transducing zone 56 is not so large as to permit objectionable fringing flux wavelength dependent coupling from the physical gap 20 of the transducer 10 to the magnetic storage medium. Such objectionable coupling will occur at least when the length, l, of the transducing zone 56 becomes so large that it appears to the transducer 10 and magnetic storage medium equivalent to an air space that exists in arrangements without a keeper 28. The thickness and bias flux needed to achieve the desired reduction in playback loss can be determined empirically.

In the embodiment of FIG. 2, the overall size of the planar surface of the keeper 28 matches that of the underlying surface 57 of the faces of front cores. Alternatively, the keeper may differ in size, while it bridges the physical transducing gap 20 provided between the confronting magnetic pole faces 18, 19 of the faces of front cores 14, 15. For better clarity of representation in FIG. 2, the shape of the front cores 14, 15 underlying the keeper 28 is shown by interrupted lines. The back cores 16, 17 are also formed as oppositely oriented wedge sections similar to the front cores 14, 15. However, the back cores may be of a rectangular or any other convenient shape suitable to provide a bias control flux for selectively saturating the front cores 14, 15.

Each of the control windings 38, 39 is wound around each back core 16, 17 at an angle, preferably at right angles to the direction in which the transducing signal winding 21 passes through the front cores. By the foregoing arrangement of the signal and control windings, respective information signal (transducing) flux 40 and bias control flux on paths 41, 42 are induced in the transducer cores. The bias control flux on paths 41, 42 extend transverse (which is substantially perpendicular in the particular embodiment illustrated in FIG. 2) to the signal flux 40 and flow substantially parallel to the width W of gap 20. This reduces the influence of the bias control flux on the signal flux.

The magnetic material of the front and back cores and of the keeper are selected to be the same. Moreover, the combined cross sectional areas of each front core 14, 15 and keeper 28 in a plane perpendicular to the bias control flux paths 41, 42 are selected smaller with respect to corresponding cross sectional areas of the back cores 16, 17 to assure that the back cores will not be saturated by the bias control flux. The material of the back cores could be selected to have a greater saturation density than the material of the front cores and keeper, to avoid saturation of the back cores.

With further reference to FIG. 2 respective bias control currents I1, I2 are applied to the control winding 38, 39. As is well known from the theory of electromagnetism, a magnetic flux is thereby induced in each back core 16, 17 in a direction perpendicular to the direction of the control current flow. The bias control flux from the back cores 16, 17 is coupled into the closely spaced front cores 14, 15, respectively, and into the keeper 28 superposed therewith. The bias control currents I1, I2 are applied, for example, from respective D.C. control voltage sources 30, 31 via variable resistors 32, 33 to flow through the respective control windings 38, 39. The magnitude of the bias control current I1 is selected such that a resulting control flux 41 induced from the back core 16 into the front core 14 saturates a portion 44 thereof and of the overlying keeper layer 28, having a width W1. The magnitude of bias control current I2 is selected to induce a control flux 42 from back core 17 into front core 15 and the overlying keeper layer 28 to also saturate a portion 45 having a width W2. The respective saturated portions are designated by cross-hatched areas. In this particular transducer-keeper combination embodiment, the uppermost and lowermost portions of the front cores will not become saturated in areas where the front and back cores are in intimate contact with each other. Only areas within a reduced width W' will be saturated.

The entire portion of the keeper 28 which bridges the physical gap 20 is saturated along the width W by the control fluxes 41, 42, as shown by cross-hatched area 29, because of its vary small cross sectional area as discussed previously in the direction perpendicular to the flux paths 41, 42. The saturated area 29 represents a virtual gap formed in the keeper 28 by the directed bias control flux. The saturated core portions 44, 45 define respective adjacent permeable unsaturated portions or regions which overlap across the virtual gap 29. The overlapping permeable portions separated by the virtual gap 29 define a permeable transducing zone 56 of width W3. More specifically, an upper edge of the transducing zone 56 is defined by the saturated zone 44 and its lower edge by the saturated zone 45. It is seen from FIG. 2 that the total gap width W'=W1+W2+W3 is a constant, while a portion thereof having a width W3 becomes effective as a transducing zone 56 when control currents I1, I2 are applied.

When current values I1, I2 are maintained constant, for example by setting the variable resistors 32, 33 at a constant value, the transducing zone will assume a fixed position. This application may be useful to obtain recording along longitudinal tracks such as shown at 37 in FIG. 8C. By increasing the magnitude of one control current, for example I1, while correspondingly decreasing the magnitude of the other control current I2, the respective widths W1, W2, change correspondingly and the transducing zone 56 will be selectively moved along the width W' of the gap 20. For example, when it is desired to periodically scan the transducing zone 56 at a high speed along the width W', a control circuit can be utilized which periodically changes linearly in opposite directions the magnitudes of both currents I1, I2, thereby changing the widths W1, W2 of the saturated portions 44, 45 in opposite senses. To maintain a constant width W3 of the transducing zone 56 during scanning, it is necessary to maintain a constant sum of the changing control currents, that is I1+I2 equals a constant.

During recording/reproduction on longitudinal or helical tracks, the position of the transducing zone may be stepped from track to track. In other applications, recorded helical tracks 34, as shown in FIG. 8B, may be record and reproduced by fixedly mounting the transducer 10 of the transducer-keeper combination to a rotating or other transducer translating member, such as a disc or drum, while the keeper 28 is detached from the trancducer 10 and placed stationary in proximity to the transducer 10 and record medium. In such arrangement, the position of the transducing zone 56 within the keeper 28 is moved across the record track width for optimum playback performance as a result of the translation of the transducer 10 relative to the keeper 28.

FIG. 3 is a diagrammatic showing of a schematic control circuit 54 which can be used in place of D.C. sources 30, 31 and resistors 32, 33 of FIG. 2, to drive the control windings 38, 39 of transducer 10 of FIG. 2 for controlling the position of a transducing zone 56 along the width W' of the saturated virtual gap 29 in the keeper 28. In the presently described preferred embodiment, the transducing zone 56 is periodically scanned along transverse tracks 35 of magnetic tape 36, as shown in FIG. 8A. Control circuit 54, however, may be adapted to obtain different operating modes of the transducer 10 when utilized in other recording/reproducing applications as previously mentioned.

The circuit 54 of FIG. 3 utilizes an A.C. control voltage source 61 generating a periodically changing control voltage, Vc, to effect electronic scanning of the transducing zone 56 across the width W' of the keeper 28 and, hence, across the tape 36. Voltage, Vc, is converted by the circuit of FIG. 3 into differentially changing control currents I1, I2 as follows. The voltage, Vc, is applied via a resistor 62 to an inverting input of a first operational amplifier 63, which has a feedback resistor 64, and represents a voltage follower. The output of amplifier 63 is connected via a further resistor 65 to an inverting input of a second operational amplifier 66 which has a feedback resistor 67. Amplifier 66 inverts the output signal of amplifier 63. The output of first amplifier 63 is also connected via a resistor 68 to an inverting input of a third operational amplifier 69 having a feedback resistor 70. The output of second amplifier 66 is connected via a resistor 71 to an inverting input of a fourth operational amplifier 72 having a feedback resistor 73. An adjustable potentiometer 74 is connected between a source of negative D.C. voltage and ground to obtain a control current offset, Io. The output of potentiometer 74 is connected via a resistor 75 to the inverting input of third amplifier 69 and via a resistor 76 to the inverting input of fourth amplifier 72, respectively. The output of the third amplifier 69 is connected to the previously described first control winding 38 of transducer 10, which in turn is connected via feedback resistor 70 to the inverting input of amplifier 69. Similarly, the output of the fourth amplifier 72 is connected to the previously described second control winding 39, whose second terminal is connected via feedback resistor 73, to the inverting input of amplifier 72. The connection between coil 38 and resistor 70 is grounded via a resistor 77. Similarly, the connection between coil 39 and resistor 73 is grounded via a resistor 78. As described previously, the respective noninverting inputs of all four operational amplifiers 63, 66, 69 and 72 are grounded. The amplifiers 69, 72 and respective resistors 70, 77 and 73, 78 represent a first and second current source, respectively.

In operation, the voltage, Vc, from source 61 is applied via voltage follower 63, 64 to a first current source 69, 70, 77 which applies to the first control winding 38 a control current I1, which is directly proportional to input voltage, Vc. The voltage obtained at the output of amplifier 63 and inverted by the inverter 66, 67 is further applied to the second current source 72, 73, 78 which applies to the second control winding 39 a control current I2 inversely proportional to the input voltage, Vc. The potentiometer 74 connected to a negative DC voltage sets a desired control current offset, Io, which in the presently described embodiment is half way between the minimum and maximum control current values (that is $Io=(Imax-Imin)/2$) for reasons that will be described below in more detail with reference to FIG. 4.

It follows from the foregoing description that when voltage Vc has a periodically changing amplitude between Vcmin and Vcmax as shown in the diagram of FIG. 4, circuit 54 converts the thusly changing control voltage into substantially linearly changing control currents I1, I2 obtained at the outputs of the first and second current sources, respectively. The control currents I1, I2, thus change differentially, that is in an opposite sense with respect to each other while changing substantially in linear proportion to the input voltage Vc as depicted in FIG. 4 and defined by the following equations:

$$I1 = KVc + Io \qquad (1)$$

$$I2 = -KVc + Io \qquad (2)$$

where K and Io are constants dependent on the parameters of the circuit of FIG. 3 and can be derived therefrom.

As described previously, the respective control fluxes 41, 42 most desirably extend in substantially perpendicular paths to the direction of the signal flux 40, resulting in reduction of interference between these fluxes. However, this is not a necessary condition for proper transducing in accordance with the transducer-keeper combination of the present invention. To obtain high quality performance with the method and apparatus of the invention, a well defined boundary between adjacent regions within the keeper body responsible for the transducing zone should be achieved. In the preferred embodiment being described, the boundaries of interest are the boundaries between the saturated and unsaturated areas, i.e., the boundaries between the virtual gap 29 in the keeper 28 and the unsaturated areas adjacent thereto and the boundaries between the regions of the saturated portions 44 and 45 in the keeper and the unsaturated areas adjacent to them. The well defined boundaries are obtained in this preferred embodiment by selecting the shape of the confronting front cores such that a maximum rate of change in permeability between adjacent cross-sectional areas of each core is obtained across the transducer width W. The foregoing assures that while a selected area of each front core is saturated by a control current so that no appreciable flux passes therethrough, an immediately adjacent contiguous area remains sufficiently permeable as is necessary for transferring information signals between the magnetic storage medium and the transducer 10. In other words, the performance of the transducer-keeper combination depends on the steepness of a permeability versus flux density gradient between each adjacent saturated and unsaturated region within each front core and the keeper body.

As an example, FIG. 5 shows a well known permeability m versus flux density B characteristic of a suitable magnetic core material, for example ferrite PS52B made by Ampex Corporation. As it is seen from that characteristic, a relatively high permeability m, greater than 400, is obtained at a flux density B below B1=4000 Gauss, which high permeability is sufficient for desired flux coupling operation. The saturation flux density of that material is approximately B2=6000 Gauss, corresponding to a permeability below 100. Consequently, for obtaining a sharp transition between a highly permeable region and an adjacent saturated region within the transducer front core, the permeability must change rapidly from below 100 to over 400 in either direction, as it is seen from FIG. 5.

FIG. 7 shows an example of two superposed flux density versus permeability characteristics 53, 53a, each corresponding to the characteristic of FIG. 5, and each pertaining to one oppositely oriented wedge shaped front core 14, 15. FIG. 6 is a schematic front view representation of confronting front cores 14, 15 of FIG. 2 rotated by 90 degrees, having a reduced width W', and without showing the keeper 28 superposed on these cores. It is understood that when the keeper 28 is superposed on the front cores 14, 15 as shown in FIG. 2, the herein described control operation remains substantially unchanged and the portions of the keeper in contact with the front cores will have the same saturated/unsaturated characteristics as the underlying front cores. The cross-hatched area 44, 45 represent the saturated core portions having a permeability less than 100. The other core portions in FIG. 6 represent unsaturated highly premeable areas 46, 47 having a premeability over 400. The unsaturated zone which extends across the transducing gap 20 is formed by the overlapping unsaturated highly permeable regions 46, 47. It is understood that this zone in the core portions causes the transducing zone in the keeper 28 when it is superposed with the core. The transducing zone 56 corresponds to overlapping portions of superposed characteristics 53, 53a, each have a permeability greater than 100. From FIGS. 6 and 7 it is seen that it is desirable for having a well defined transducing zone 56, that the overall permeability versus flux density gradient be as sharp as possible. This can be obtained by selecting a material for the transducer core and keeper having a steep characteristic curve, and by designing the wedge section such that large flux density changes take place between adjacent cross-sectional areas over the transducer width W' corresponding to the scanning direction. To further increase the permeability gradient, a transducer core material is preferably used having a magnetic anisotropy, and the core is oriented with an easy axis of magnetization perpendicular to the physical gap plane.

To further maximize the permeability gradient between two adjacent cross-sectional areas for obtaining desired permeability versus flux density characteristics, it is possible to approximate the shape of the wedge sections to that of the curve of FIG. 5, for example, to obtain cross-sectional areas of the wedge shaped front cores 14, 15 that exponentially increase in the direction of the transducer width W. The foregoing can be obtained by providing exponentially increasing side surfaces 48, 49 of front cores 14, 15, as is shown in phantom in FIG. 6.

To simplify control of the portions of the front cores which are saturated, a predominant portion of the bias control flux generated on each path 41 or 42 by a respective one of the back cores 16 or 17 should not be coupled into the other back core. The signal flux also should not be coupled to the back cores. Therefore, it is preferable to provide between back cores 16, 17 a gap 50 of a substantially greater length L then the length 1 of the gap 20 provided between the front cores 14, 15. Preferably, the ratio L:1 is selected to be 10:1 or more. Both dimensions 1 and L are shown in the FIGS. as exaggerated for illustration purposes.

It is seen from the foregoing disclosure that the transducer of FIG. 2 is relatively simple to manufacture, while various desired core shapes may be obtained to maximize the permeability gradient in the keeper across the potential transducer width. It is preferable to hold the resulting transducer structure in a non-magnetic holder (not shown) and to bond the respective transducer core elements together, for example by epoxy, utilizing well known bonding techniques. However, such bonding material is deleted from the drawings to facilitate illustration of the embodiment of the invention.

FIGS. 9 and 10 are exploded schematic views of the transducer-keeper embodiments like that of FIG. 2, which illustrate the operation, particularly with respect to the bias control flux paths in the keeper 28. In the embodiment of FIG. 9, the control currents I1, I2 in the respective control windings 38, 39 have the same direction, resulting in bias control flux paths 41, 42 extending through the front cores 14, 15 and keeper 28 in the same directional sense. The magnetic poles at adjacent ends of both front cores 14, 15 are a like and designated as north poles N at the upper end of gap 20 and as south poles S at the lower end. By selectively saturating areas 44, 45 of the respective front cores 14, 15 and overlying portions of keeper 28, the area 29 of the keeper bridging the physical gap 20 becomes saturated as previously described, and it froms a virtual gap 29. The control flux lines 41, 42 extend through the saturated portion 29 of the keeper 28 in substantially straight lines between the opposite poles N, S. The saturated areas 44, 45 and 29 are shown in FIG. 9 as cross-hatched areas. The areas of the front cores 14, 15 and keeper 28 adjacent to the saturated areas remain permeable and they form a transducing zone 56 across the virtual gap 29, as has been described above with reference to FIG. 2. The width W3 and location of the transducing zone 56 can be positioned, moved or scanned along the width W of the transducer-keeper combination by controlling the magnitudes of the control currents I1, I2 as previously described.

In the embodiment of FIG. 10, the control currents I1, I2 flow in opposite directions with respect to each other through the control windings 38, 39. Consequently, in the front cores 14, 15 oppositely oriented magnetic poles N, S are formed at adjacent ends of the oppositely oriented wedge sections across the physical gap 20. In this instance, the areas 44, 45 of the front cores and the portions 29 and 29" of the keeper are saturated by the bias control flux on paths 41, 42 flowing in opposite directions. Flux on these oppositely oriented paths is repelled and diverted. Because of the diversion of the flux paths, there is an area 60 formed betweeen respective saturated regions 29a and 29b which has a flux density far below the saturation density of the keeper 28, thus it is relatively flux free and does not saturate, i.e., it is highly permeable. Because this region or zone 60 is formed by the bucking effect of the opposing fluxes, it will be further referred herein as the "bucking region" or "bucking zone".

Portions 29a and 29b of the saturated regions 29 and 29", respectively, which separate unsaturated, highly permeable areas of the core pieces 14, 15 and superposed keeper 28, form virtual gaps 29a and 29b. Consequently, highly permeable transducing zones 56a, 56b for coupling magnetic flux are defined. Those portions of saturated keeper regions 29 and 29" adjacent to saturated regions 44, 45 do not form transducing zones. Consequently, in the embodiment of FIG. 10, each transducing zone 56a, 56b is defined on one side by a saturated area 44, 45, respectively, and on its other side by the bucking zone 60. Each zone 56a, 56b may be used to record or play back a signal on or from a magnetic medium.

When comparing the embodiment of FIG. 10 to that of FIG. 9, it is seen that instead of one transducing zone 56 as in the embodiment of FIG. 9, two such zones 56a, 56b separated by the bucking zone 60 are provided. As will be further described with reference to FIGS. 11A to 11D, the thusly obtained zones 56a, 56b, 60 can be positioned, moved or scanned along the width W of the keeper 28 by controlling the magnitude of the control currents I1, I2, as previously explained with reference to FIGS. 3 and 4. Such figures show respective track profile characteristics obtained by measuring a playback signal output of a transducer-keeper combination in accordance with the above-described embodiment of FIG. 10. As an example, a track 0.006 inches wide, shown at 133, is prerecorded longitudinally on a magnetic tape 134 and the tape placed in contact with the surface 43 of the keeper 28. The length of track 133 is perpendicular to the width W of the physical gap 20. By selectively saturating the transducer front cores 14, 15 and the keeper 28, respective transducer zones 56a, 56b are obtained, separated from each other by a bucking zone 60, as previously described with reference to FIG. 10.

Characteristic line 135 on the graph included as FIG. 11D is obtained by moving the tape 134 in the direction of arrow 137, while measuring an output signal from the transducing winding 21 for each changed position. As the tape is moved, the output signal varies proportionally to the flux coupled from the tape 134 to the transducing winding 21, which is detected by the transducer-keeper combination as the track 133 is zoned relative to the same. (This is assuming, of course, that the position of the transducing zones 56a, 56b and the bucking region 60 are held stationary). In this example, the graph line represents track displacements of 0.005 inches. It is seen from FIG. 11D that the characteristic 135 has two peaks, each corresponding to one transducing zone 56a, 56b, shown in FIG. 11B. It is also seen from the shape of the characteristic 135 that the transitions between high and low playback signal outputs corresponding to the transitions between the bucking zone 60 and the transducing zones 56a and 56b are substantially steeper than the transitions on the other sides of the zones 56a and 56b between unsaturated and saturated regions. The foregoing illustrates improved track-edge definition by providing a bucking zone adjacent to the transducing zones. The improved track-edge definition is primarily due to the effect of the opposing fluxes in the bucking zone 60 virtually eliminating flux from the zone. Without the opposing fluxes, such as at the boundries of zones 44, 45 (FIG. 10) proximate the transducing zones 56a, 56b, there is a small, but finite transition region between the saturated and unsaturated regions.

A second characteristic is shown in FIG. 11D by interrupted line 136. It is obtained by changing the values of the control currents I1, I2 and thereby shifting the transducing zones 56a, 56b and the bucking zone 60 of FIG. 11B in the direction of arrow 138 to a new position, as shown in FIG. 11C at 56a', 56b' and 60'. (As seen from FIG. 11C, the respective widths of these zones in the direction W have not changed substantially.) The measurement described with reference to characteristic 135 is repeated for the shifted zones, and the measured values are plotted to obtain the resulting characteristic line 136. Characteristic lines 135, 136 are similar, each having respective high output peak portions designated N, R; P, S for characteristic line 135; and N', R'; P', S' for characteristic 136, which portions correspond to transducing zones 56a, 56b; and 56a', 56b'; respectively. In addition, each characteristic line represents a low output or valley portion R,P for characteristic 135 and R', P' for characteristic 136, corresponding to the bucking zones 60, 60'.

FIGS. 12 and 13 show other another transducer-keeper combination embodiments in accordance with the present invention. The transducer 90 of each of the embodiments shown in FIGS. 12 and 13 is made up of two confronting cores 91, 92 which are similar to the cores 11, 12 of the embodiment of FIG. 2 in that each core has front core portion 94, 95 and a back core 96, 97 portion abutting at confronting planar surfaces 98 and 100. However, the cores 91, 92 are rectangular, rather than wedge shaped. Moreover, each back core 96, 97 has three legs which form two grooves utilized as control winding windows 102 to 105 to accommodate respective control windings 106 to 109. These windows and windings are best shown in FIG. 13. In this embodiment the keeper 28 is made of a thin, soft magnetic material having the characteristics previously described with respect to FIG. 2. In the embodiment illustrated by FIG. 12, each control winding 106 to 109 is connected to a separate control voltage source 110 to 113, respectively, via a variable resistor 114 to 117. The variable resistors permit adjustment of the magnitudes of the control currents in the control windings. Alternatively, two control windings diagonally arranged on opposite sides may be interconnected, as illustrated for the embodiment shown in FIG. 13.

The operations of the transducer-keeper combinations of FIGS. 12 and 13 basically are the same. Their operations will be described hereinafter with reference to FIG. 13. FIG. 13 is a schematic representation of a front elevation view of the keeper 28, taken in the direction of arrow 123 of FIG. 12. To facilitate showing of the control flux paths 124 to 127 extending between the rear cores 96, 97 and keeper 28 via front cores 94, 95, the rear cores are shown as being rotated by 90 degrees to have their lateral surfaces 128, 129 extending in the plane of the keeper 28. The control windings 106 to 109 are connected to respective control voltage sources such that the outer legs of each back core form magnetic poles of the same polarity while the inner leg has a different polarity. As a result of such opposite orientation there are obtained oppositely oriented flux lines 124 to 127 extending in the virtual gap area 29 of the keeper 28.

Because of the oppositely oriented magnetic poles, the respective control flux paths originating in the back cores 96, 97 saturate only portions 29a, 29b and 29c of the keeper 28 bridging the physical gap 20, as shown in FIG. 13. In places where the flux on the control paths originating at one of the back cores 96, 97 approaches the oppositely oriented flux on the paths originating at the other one of the back cores 96, 97, such flux is repelled and diverted. A predominant portion of the flux returns to the same rear core where it originated. As a result of the above described flux diversion, respective bucking regions 130, 131 are formed which separate the adjacent saturated regions 29a to 29c. These bucking regions are similar to the previously described bucking region 60 in the embodiment of FIG. 10. As has been described previously with reference to FIG. 10, the flux density in the bucking regions 130, 131 is far below the saturation density of the keeper. Consequently, the region 29 of the keeper 28 bridging the gap 20 does not saturate in the bucking region.

It follows from the foregoing description that the transducer-keeper embodiments of FIGS. 12 and 13 have three saturated regions 29a to 29c provided in the keeper 28, separated from each other by relatively flux free regions or bucking zones 130, 131. Because the rest of the keeper area 28 surrounding the saturated regions, as well as of the underlying front cores 94, 95, remain unsaturated and highly permeable, the saturated areas 29a to 29c provide respective transducing zones in the keeper similar to those previously described with reference to FIGS. 2, 9 and 10.

When desired, the outer transducing zone 56a and 56c may be eliminated by spacing the front cores 94, 95 (FIG. 12) at a distance from the keeper 28, at both ends of the keeper width W. The cores 94, 95 will still provide a necessary flux path between the back cores 96, 97 and keeper 28, but there will be an increased reluctance in the flux path to prevent saturation of the areas 29a and 29c. Alternatively, a record medium, for example magnetic tape (not shown), of a reduced width may be utilized which spans only a portion of the keeper width between lines 151, 152, thereby excluding transducing zones 56a and 56c from coupling a signal with respect to the medium.

It is seen from FIGS. 12 and 13 that the control windings which are diagonally located from each other on opposite cores 96, 97 are connected to respective D.C. sources of the same polarity. Consequently, to move the transducing zone 29b in one direction along the keeper width, the control currents of one polarity, for example, I1', I2'' are increased while the control currents I1'', I2' of opposite polarity are decreased, in a similar way as previously described with reference to FIG. 2.

FIG. 14 shows a partially exploded view of a further embodiment of the electromagnetically controlled scanning transducer-keeper combination of the invention which is similar to the above-described embodiments of FIGS. 12 and 13. However, the transducer 140 of the FIG. 14 embodiment has its back cores 96, 97 joined to the front cores 94, 95 by surfaces 98, 100 of the back cores abutting oppositely lateral surfaces 141, 142 of the front cores. These joined surfaces 98, 141 and 100, 142 extend at an angle "c" with respect to the front surface 43 of the keeper 28 to avoid contact with a record medium, for example tape 146. The foregoing structural change does not substantially alter the previously described control flux paths shown in FIG. 13. The control windings 106 to 109 are connected to respective control voltage sources as has been described with reference to FIGS. 12 and 13.

The above-described way of joining the back cores to the front cores allows an additional magnetic back core 144 to be attached to the front cores 94, 95, to accomodate a transducing signal winding 145. This embodiment is particularly useful for applications where a sufficiently small dimension D of the transducing zone 29b in the direction of the keeper width W is required. In that case the other, orthogonally oriented dimension thereof becomes a track width TW. Both dimensions D and TW are illustrated in FIG. 14. The above-described back core 144 and transducing winding 145 serve to provide a transducing flux path 148 which fringes across the virtual gap 29b provided in the keeper 28, substantially in parallel with the length D thereof. This embodiment is especially suitable for transducing long transverse tracks of a record medium as, for example, shown at 118 in FIG. 14. (The front surface of the front cores 94, 95 and the keeper 28 are shown slightly curved or contoured to obtain a better keeper-to-medium contact.)

In the transducer-keeper configurations shown in FIGS. 12 to 14, when the control currents in the oppositely oriented control windings have equal values and thus the oppositely oriented bias fluxes in the control flux paths established thereby are equal, cancellation of these fluxes may occur to such extent that a desired saturation in the keeper 28 may not take place. To overcome the foregoing, the current values I1, I2, are preferably offset by a constant bias value, for the entire range of control current values. When one of the currents then is increased while the other is decreased to control the location of the transducing zone, a constant bias offset for forming the transducing zone will be maintained throughout the operating range. Alternatively, cancellation of the control fluxes within the operating range of the transducer may be prevented by providing control flux paths having gradually increasing reluctances in opposite directions along the transducer width on opposite sides of the physical gap. For example, to obtain the foregoing a space of variable depth (not shown) may be provided between the front and back cores of the transducer. Such a wedge-like spacing would vary in the direction of the gap depth along the transducer width.

A further example of obtaining control flux paths having gradually increaing reluctances along the transducer width is shown in FIG. 15. The transducer-keeper combination of FIG. 15 is an alternative embodiment to the above described embodiments of FIG. 12-14. The transducer 90a of FIG. 15 differs from the transducer 90 of FIGS. 12-14 in having oppositely oriented wedge-shaped back and front cores 91a, 92a, 94a, 95a instead of the rectangular cores of the embodiment of FIGS. 12-14. Because of the similarities between these embodiments, corresponding elements in these figures are designated by like reference numberals, while a suffix "a" has been added to the wedge shaped cores and resulting control flux paths of the embodiment of FIG. 15. These wedge shaped cores 91a, 92a, 94a, 95a have cross-sectional areas gradually increasing in opposite directions on either side of the gap 20 along the width of the transducer. Consequently, the resulting oppositely oriented control fluxes 124a, 126a corresponding to those fluxes 124-127 illustrated in FIG. 13 are inherently offset due to varying flux density along the transducer width W. Undesirable control flux cancellation is thereby prevented.

FIG. 16 is an example of a recording/reproducing apparatus utilizing the above-described stationary electromagnetically controlled scanning transducer-keeper combination of FIG. 14. In such recording/reproducing apparatus, there is shown a record signal processor 166 for processing a signal prior to recording on tape 146, and a playback signal processor 168 for processing a signal played back from the tape. The apparatus of FIG. 16 is especially suited for high density recording and playback of television signals or other high frequency, wideband signals along transverse tracks 118 of tape 146 moving longitudinally in the direction 147. For example, it may be used for segmented recording and playback of video signals, that is television signals having information pertaining to one field of the television signal recorded along a number of discrete tracks on tape.

A switch 174 is shown for selecting a recording or a playback operation mode. A record current, Is, is applied from the recorder amplifier 170 to the transducing winding 145 via switch 174 and line 176. Alternatively, the line 176 and switch 174 couple a playback voltage, Vs, from the transducing winding 145 to the playback amplifier 172. Because recording and playback signal processors, such as shown at 166, 168, and amplifiers 170, 172 are well known in the art, a detailed description thereof is not included herein.

A drive control circuit 54 corresponding, for example, to the previously described circuit of FIG. 3, is utilized to drive the control windings 106 to 109 in accordance with the foregoing disclosure. A servo system 180 is utilized for coordination of the scanning of the transducing zone 29b effected by the drive circuit 54 and the longitudinal tape movement effected by capstan 193 and motor 194. During recording operations, the servo system 180 functions to coordinate the scanning rate of the transducing zone 29b and speed of transport of the tape 146 so that the recorded tracks 118 are uniformally distributed along the tape transversely at a precise angle relative to the tape's longitudinal direction. In addition a track 184 of control signal is recorded in the longitudinal direction 147 on tape 146 by a stationary transducer 182 to facilitate during reproduction coordination of the scanning of the transducing zone 29b and transport of the tape 146. During reproduction the transducer 182 is utilized to reproduce the recorded control signal from track 184 in a manner well known in the art and is employed to synchronize the transport of the tape 146 with the scanning of the transducing zone 29b. A multiple pole switch 186 connects the winding 183 of transducer 182 and a servo circuit 191 with an input line 187 when in the position indicated during a recording operation mode. When in the other position indicated, the switch 186 connects the winding 183 with the servo circuit 191 and disconnects the input line 187, and hence, the control signal, from the servo circuit and transducer 182. In place of the control signal, switch 186 couples a reproduce or play reference signal received on line 196 to the servo circuit 191 for use in a manner that will be described further hereinafter.

During recording, a control signal, typically, at a rate of one-half the vertical television field rate, is received on line 187. The signal on line 187 is applied via the switch 186 and line 188 to the winding 183 of transducer 182. Consequently, the transducer 182 records that signal along track 184 on tape 146 simultaneously as information signals are recorded along the transversely extending tracks 118. The control signal on line 187 is applied at that time via switch 186 to the servo circuit 191, which in turn controls the operation of the drive control circuit 54 to be synchronous with the signal on line 187. The synchronous condition is obtained by comparing the control signal to a signal received from the drive control circuit 54 via line 190 that is indicative of the scanning rate and position of the transducing zone 29b. The servo circuit 191 responsively generates a correction signal that corrects deviations of the actual location of transducing zone 29b from the desired location indicated by the control signal on line 187.

During playback, the servo circuit 191 receives information related to the scanning rate and position of the transducing zone 29b received from the drive control circuit 54 via line 190. The servo circuit 191 compares the information received via line 190 to the control signal information reproduced by transducer 182 and received over line 189. In response to this comparison, correction signals are generated on lines 192 and 199. The line 192 couples the received signal to the drive control circuit 54 to cause acceleration or deceleration of scanning of the transducing zone 29b along the width W of the keeper 28. The line 199 couples the received correction signal to the motor 194, which controls the capstan 193 to adjust correspondingly the transport of the tape 146. This control of the capstan 193 and drive control circuit 54 results in maintaining registration of the scanning transducing zone 29b over the tracks 118 extending transversely along the tape 146. Such transducer-to-track registration control can be enhanced by use of a high resolution tachometer operatively linked to the capstan 193 that provides a high rate signal indicative of the speed of transport of the tape 143. This tachometer signal is coupled to the servo circuit 191 for comparison with the play reference signal provided over line 196. A resulting correction signal is generated which is provided over line 199 to the motor 194 for corresponding control of the capstan 193.

It follows from the foregoing description that the apparatus of FIG. 16 is suitable for recording and playback of signals along transverse tracks of a longitudinally moving medium which is in contact with an outer surface of a keeper, utilizing the transducer-keeper combination of the present invention. The medium is out of contact with the physical gap and therefore the gap responsible for the formation of the keeper transducing zone is not exposed to wear or erosion. The wear of the transducer-keeper combination is reduced to that due to a relatively slowly advancing medium in contact with an outer surface of a stationary gap-less keeper. At the same time the keeper shunts any portion of the control flux which may fringe from the physical gap, thereby substantially reducing signal erasure of the medium. Moreover, spacing losses are avoided in view of the contact of the keeper and magnetic storage medium of the record medium.

While the invention has been shown and described with particular reference to various embodiments thereof, it will be understood that variations and modifications in form and details may be made without departing from the spirit and scope of the invention as defined in the appended claims.

What is claimed is:

1. A magnetic transducing head arrangement for recording and/or reproducing information in a record medium, comprising:
   a magnetic core which defines a flux path, said core being comprised of two poles having a non-magnetic gap between them to effect coupling of flux to and from said flux path in the core;
   a body of magnetic material which bridges said gap in said magnetic core to receive flux coupled by said gap from said flux path in said core, said body of magnetic material having a uniform magnetic reluctance across said body where it bridges said gap;
   means for generating a bias control flux in said magnetic core which is coupled by said gap into said body of magnetic material where it bridges said gap to establish therein adjacent regions of substantially different magnetic permeability forming a signal transfer zone at which magnetic information flux is coupled between said body of magnetic material and a record medium when positioned magnetically proximate the signal transfer zone in said body; and
   a signal winding disposed on said magnetic core and electromagnetically coupled with said flux path in said core for detecting and/or generating the magnetic information flux which is coupled between said body of magnetic material and said record medium at said signal transfer zone.

2. The arrangement of claim 1 in which there is relative movement between said core and said record medium during recording and/or reproducing of information, and said body of magnetic material is disposed to be simultaneously magnetically proximate said core and said record medium during such time there is relative movement between said core and record medium, further characterized in that said body is positioned to be between said core and record medium during said movement.

3. The arrangement of claim 1 further characterized in that said body of magnetic material is in contact with at least one of said record medium and core during the coupling of magnetic information flux between said body and said record medium.

4. The arrangement of claim 3 wherein said non-magnetic gap has a width dimension, said generating means includes an electrical control winding electromagnetically coupled to said magnetic core and a current supply means for applying a control current to said control winding to provide said bias control flux at a magnitude that saturates said body of magnetic material where it bridges said non-magnetic gap at a location along the width dimension of said gap determined by the magnitude of the bias control flux to form said signal transfer zone; and
   means are provided for varying the magnitude of said control flux to thereby vary the location of said signal transfer zone in the body of magnetic material in the direction of said width dimension of said gap.

5. The arrangement of claim 1 wherein one of said adjacent regions of substantially different magnetic permeability is magnetically saturated whereas the other thereof is an unsaturated region.

6. The arrangement of claim 1 wherein said adjacent regions of substantially different permeability have a steep magnetic permeability gradient therebetween.

7. The arrangement of claim 5 wherein said unsaturated region generally is free of magnetic flux.

8. The arrangement of claim 1 wherein said non-magnetic gap has a width dimension and the location of the adjacent regions of different magnetic permeability in said body of magnetic material along the width dimension is determined by the magnitude of the bias control flux; and
   means are included for varying the magnitude of the bias control flux to vary the location of said adjacent regions of different magnetic permeability and move said signal transfer zone within said body of magnetic material along said width of said gap.

9. The arrangement of claim 8 further characterized in that said means for varying the location of said signal transfer zone within said body of magnetic material periodically varies the magnitude of the bias control flux to scan the location of said signal transfer zone along a defined path within said body of magnetic material.

10. The magnetic transducer arrangement of claim 1 wherein said magnetic core comprises a corresponding pair of core portions extending on opposite sides of said gap, and wherein said generating means comprises a respective control winding associated with each of said core portions.

11. The magnetic transducer arrangement of claim 10 wherein said corresponding core portions define a width dimension along which the non-magnetic gap extends and provide control flux paths having gradually increasing reluctances along the width dimension of said gap with the reluctance of the control flux path of one core portion increasing in a direction opposite that of the other core portion.

12. The magnetic transducer arrangement of claim 11 wherein said corresponding core portions form oppositely oriented wedge sections defining a width dimension along which said gap extends therebetween, each respective wedge section having a cross-sectional area gradually increasing along the width dimension with the cross-sectional area of each wedge section increasing in a direction opposite that of the other to provide said control flux paths having gradually increasing reluctances in opposite directions.

13. The magnetic transducer arrangement of claim 10 wherein said corresponding core portions define a width dimension along which the non-magnetic gap extends; and
   further comprising current supply means for applying control currents to said control windings for providing a bias control flux at a magnitude that saturates said body of magnetic material where it bridges said non-magnetic gap at a location along the width dimension of said gap determined by the magnitude of the bias control flux to form said signal transfer zone.

14. The magnetic transducer arrangement of claim 13 wherein said current supply means is coupled to apply control currents to maintain said signal transfer zone of a constant width and at a predetermined location along the width dimension of said non-magnetic gap.

15. The magnetic transducer arrangement of claim 13 wherein said current supply means is coupled to vary the magnitudes of said control currents to thereby vary the location of said signal transfer zone in the direction of the width dimension of said gap.

16. The magnetic transducer arrangement of claim 15 wherein said current supply means is coupled to vary the magnitudes of said control currents linearly and in opposite sense with respect to each other while maintaining a constant sum of said control currents, to maintain a constant width of said signal transfer zone while its location is varied in the direction of the width dimension of said non-magnetic gap.

17. The magnetic transducer arrangement of claim 16 wherein said current supply means periodically varies the magnitudes of said control currents to obtain periodical scanning of said signal transfer zone in the direction of the width dimension of said gap.

18. The magnetic transducer arrangement of claim 13 wherein said current supply means comprises means for varying the sum of said control current magnitudes to modify the width of said signal transfer zone in the direction of the width dimension of said gap.

19. The magnetic transducer arrangement of claim 1 wherein said magnetic core comprises two confronting magnetic core portions, each having a front core superposed with said body of magnetic material and a back core magnetically coupled with an associated front core, said front cores defining said non-magnetic gap therebetween, and wherein said generating means comprises a control winding associated with each such back core, respectively, for providing a bias control flux that is coupled into said body of magnetic material.

20. The magnetic transducer arrangement of claim 19 wherein each said front core defines a width dimension along which the non-magnetic gap extends and provides control flux paths along the width dimension of said gap of gradually increasing reluctances with the reluctance of the control flux path of one front core increasing in a direction opposite that of the other front core.

21. The magnetic transducer arrangement of claim 20 wherein said control windings of both said back cores are coupled to provide in said body of magnetic material respective control fluxes oriented in the same direction.

22. The magnetic transducer arrangement of claim 20 wherein said control windings of said back cores are coupled to provide in said body of magnetic material control fluxes oriented in opposite directions with respect to each other, to define two signal transfer zones separated in the direction of the width dimension of said gap by a bucking zone relatively free of control flux.

23. The magnetic transducer arrangement of claim 20 wherein said signal winding and said control windings are disposed with their respective turns extending in planes substantially perpendicular to each other.

24. The magnetic transducer arrangement of claim 20 wherein said signal winding and said control windings are disposed with their respective turns extending in planes substantially parallel to each other.

25. The magnetic transducer arrangement of claim 19 wherein said back cores have larger cross-sectional areas in a plane perpendicular to a path of said control flux in said magnetic core than corresponding cross sectional areas of said front cores to prevent saturation of said back cores by said control flux.

26. The magnetic transducer arrangement of claim 19 wherein said magnetic core defines a width dimension along which the non-magnetic gap extends, and each of said front cores is provided in the form of a wedge section having a cross-sectional area gradually increasing in the direction of the width dimension of said gap with the cross-sectional area of each wedge section increasing in a direction opposite the that of the other wedge section.

27. The magnetic transducer arrangement of claim 26 wherein each said back core is provided in the form of a wedge section similarly oriented as said front core magnetically coupled therewith.

28. The magnetic transducer arrangement of claim 19 wherein said back cores are made of a magnetic material having a higher saturation density than that of said front cores.

29. The magnetic transducer arrangement of claim 19 wherein said magnetic core defines a width dimension along which the non-magnetic gap extends, each said back core has at least three contiguous leg portions abutting one said front core at spaced locations in the direction of the width dimension of said gap, and wherein said control windings are coupled to provide oppositely oriented control fluxes in adjacent leg portions with the orientation of control fluxes in corresponding leg portions of said confronting back cores being reversed with respect to each other.

30. The magnetic transducer arrangement of claim 29 wherein each front core has a lateral surface extending in the direction of the width dimension of said gap that faces opposite the lateral surface of the other front core, and said back cores abut said front cores at the opposite lateral surfaces thereof; and further comprising an additional back core bridging said front cores for receiving said signal winding, said signal winding having turns extending in planes substantially paralled to planes defined by turns of said control windings.

31. The transducing head arrangement of claim 1 wherein said body of magnetic material has a uniform thickness across said body where it bridges said gap.

32. The arrangement of claim 31 wherein said body of magnetic material is spaced from said magnetic core and a non-magnetic medium is positioned between said body and said core during recording and/or reproducing.

33. The arrangement of claim 31 wherein said body of magnetic material is spaced from said core and said record medium is positioned between said core and said body during recording and/or reproducing.

34. An electromagnetically controlled magnetic transducer, comprising:

two corresponding magnetic core portions with poles defining a non-magnetic physical gap therebetween to effect coupling of flux to and from flux paths in said core portions, each said core portion providing a respective control flux path substantially along a width of said transducer that has a reluctance that gradually increases along said transducer width in a direction opposite the direction that the reluctance gradually increases in the other core portion;

a body of magnetic material superposed in fixed relationship with said magnetic cores and bridging said physical gap to be magnetically coupled thereby to said core portions;

a control winding electromagnetically coupled to each said core portion, respectively, for providing a magnetic control flux coupled by said physical gap to said body of magnetic material to saturate a portion of said body in an area where it bridges said physical gap while leaving an adjacent area unsaturated to form a signal tansfer zone magnetically proximate said gap for coupling magnetic flux between said body and said core portions and between said body and a magnetic record medium when positioned magnetically proximate said body at the signal transfer zone; and an information signal winding electromagnetically coupled to said core portions for detecting and/or generating magnetic information flux extending in said core portions.

35. An electromagnetically controlled magnetic transducer, comprising:

two corresponding magnetic front core portions with poles defining a non-magnetic physical gap therebetween to effect coupling of flux to and from flux paths in said core portions;

a body of magnetic material superposed in fixed relationship with said magnetic front core portions and bridging said gap to be magnetically coupled thereby to said front core portions;

two corresponding magnetic back core portions, each being magnetically coupled with a corresponding one of said front core portions;

a control winding electromagnetically coupled to each of said back core portions, respectively, for providing a magnetic control flux extending in said back core, front core and body to saturate a portion of said body in an area where it bridges said physical gap while leaving an adjacent area unsaturated to form a signal transfer zone magnetically proximate said gap for coupling magnetic information flux between said body and a magnetic record medium when positioned magnetically proximate said body at the signal transfer zone.

36. The magnetic transducer of claim 35 further comprising an information signal winding for detecting and/or generating the magnetic information flux in said front cores.

37. The magnetic transducer of claim 36 wherein said front and back cores provide control flux paths along said width dimension of gradually increasing reluctances with the reluctance of the control flux path provided by one front core and corresponding back core increasing in a direction opposite that provided by the other front core and corresponding back core.

38. The magnetic transducer of claim 36 wherein said control and information signal windings are respectively disposed for coupling to flux paths extending in planes within said tansducer cores that are substantially perpendicular to each other.

39. The magnetic transducer of claim 36 wherein said control and information signal windings are respectively disposed for coupling to flux paths extending in planes within said transducer cores that are substantially parallel to each other.

40. An electromagnetically controlled magnetic transducer; comprising:

two corresponding magnetic front cores with poles defining a non-magnetic physical gap therebetween, which has a width dimension, to effect the coupling of flux to and from said front cores, each of said front cores being in the form of a wedge section having a cross-sectional area gradually increasing in the direction of said width dimension with the cross-sectional area of each wedge section increasing in a direction opposite the other;

a body of magnetic material superposed in fixed relationship with said magnetic front cores and bridging said physical gap to be magnetically coupled to said front cores;

two corresponding magnetic back cores, each being magnetically coupled with one said front core and provided in the form of wedge sections similarly oriented as said front cores magnetically coupled therewith;

a control winding magnetically coupled to each said back core, respectively, for providing a magnetic control flux to selectively saturate said body in an area where it bridges said physical gap while leaving an adjacent area unsaturated to define a signal tansfer zone magnetically proximate said gap for coupling magnetic information flux between said body and a magnetic record medium when positioned magnetically proximate said body at the signal transfer zone.

41. An electromagnetically controlled magnetic transducer, comprising:

two corresponding magnetic front cores defining a width dimension and having poles defining a non-magnetic physical gap between them along the extent of the width dimension to effect coupling of flux to and from said front cores;

a body of magnetic material superposed in fixed relationship with said magnetic front cores and bridging said gap to be magnetically coupled thereby to said front cores;

two corresponding magnetic back cores, each being magnetically coupled with one said front core, each said back core having at least three contiguous leg portions abutting said front core at spaced locations along the width dimension; and a control winding between each two adjacent leg portions, respectively, of each back core for providing oppositely oriented magnetic control fluxes in adjacent leg portions of the same back core, the orientation of magnetic fluxes in corresponding leg portions of said corresponding back cores being reversed with respect to each other, said control fluxes coupled by said front cores and said gap to said body of magnetic material to saturate a portion of said body in an area where it bridges said gap while leaving an adjacent area unsaturated to form a signal transfer zone magnetically proximate said gap for coupling magnetic information flux between said body and said front cores and between said body and a record medium, when positioned magnetically proximate said body at the signal transfer zone.

42. The magnetic transducer of claim 41 further comprising an information signal winding for detecting and/or generating magnetic information flux in said front cores.

43. The magnetic transducer of claim 41 wherein said corresponding magnetic front and back cores have a substantially rectangular shape.

44. The magnetic transducer of claim 41 wherein each of said corresponding magnetic front and back cores is a wedge section having a cross-sectional area gradually increasing in the direction of said width dimension with the cross-sectional area of each wedge section of one set of magnetically coupled front and back cores increasing in a direction opposite that of the other set of magnetically coupled front and back cores.

45. An electromagnetically controlled magnetic transducer, comprising:

two corresponding magnetic front core portions with poles defining a non-magnetic physical gap therebetween to effect coupling of flux to and from flux paths in said core portions;

a body of magnetic material superposed in fixed relationship with said magnetic front core portions and bridging said gap to be magnetically coupled thereby to said front core portions;

first and second corresponding magnetic back cores, each being magnetically coupled with one front core portion and having at least three contiguous leg portions abutting the front core portion, said first and second back cores abutting said front core portions at oppositely facing lateral surfaces thereof;

a control winding between each two adjacent leg portions of each back core and coupled to provide oppositely oriented magnetic control fluxes in adjacent leg portions of the same back core, corresponding leg portions of said first and second back cores having oppositely oriented magnetic control fluxes with respect to each other, said control fluxes being coupled by said front core portions and said gap to said body of magnetic material to saturate a portion of said body in an area where it bridges said physical gap while leaving an adjacent area unsaturated to define a signal transfer zone magnetically proximate said gap for coupling magnetic information flux between said body and a magnetic record medium when positioned magnetically proximate said body at the signal transfer zone; and a third, substantially U-shaped back core bridging said front core portions for accommodating a signal winding to detect and/or generate the magnetic information flux.

46. An apparatus for recording and/or reproducing an information signal with respect to a magnetic medium, comprising:

two confronting magnetic cores defining a width dimension and having poles defining a non-magnetic physical gap between them along the extent of the width dimension to effect coupling of flux to and from said cores;

a body of magnetic material superposed in fixed relationship with said magnetic cores and bridging said gap to be magnetically coupled thereby to said cores;

a control winding electromagnetically coupled to each said core, respectively, for providing a control flux coupled by said cores and said gap to said body of magnetic material to saturate a portion of said body in an area where it bridges said gap while leaving an adjacent area unsaturated to form a signal transfer zone magnetically proximate said gap for coupling magnetic flux between said body and cores and between said body and magnetic medium when positioned magnetically proximate said body at said signal transfer zone, the location of the adjacent saturated and unsaturated areas along the width dimension being determined by the control flux magnitudes; and means for varying the magnitude of said control flux in each core linearly and opposite sense with respect to the magnitude of said control flux in the other core to vary the location of said signal transfer zone in the direction of the width dimension.

47. The apparatus of claim 46 further comprising means for applying a current to said control windings for providing said control flux.

48. The apparatus of claim 46 further comprising means for advancing a magnetic medium past said body of magnetic material, and means for synchronizing said means for varying the magnitude of said control flux with said means for advancing said medium.

49. The apparatus of claim 46 wherein said means for varying the magnitude of the control flux includes means for applying a control current of selected magnitude to each control winding for providing said control flux, said applying means maintaining a constant sum of the magnitudes of said control currents to maintain the size of the signal transfer zone constant in the direction of the width dimension.

50. An apparatus for recording and/or reproducing a signal with respect to a magnetic medium, comprising:

two confronting magnetic cores defining a width dimension and having poles defining a non-magnetic physical gap therebetween to effect coupling of flux to and from said cores;

a body of magnetic material superposed in fixed relationship with said cores and bridging said gap to be magnetically coupled thereby to said cores;

a control winding electromagnetically coupled to each said core for providing a control flux coupled by said cores and said gap to said body of magnetic material to saturate a portion of said body in an area where it bridges said physical gap while leaving an adjacent area unsaturated to define a highly permeable signal transfer zone;

means for advancing a magnetic medium past said body of magnetic material at said signal transfer zone; and means for varying the magnitude of said control flux in each core linearly and in opposite sense with respect to the magnitude of control flux in the other core to vary the location of said signal transfer zone in the direction of said width dimension.

51. An apparatus for recording and/or reproducing a signal with respect to a magnetic medium comprising:

two corresponding magnetic front core portions with poles defining a non-magnetic physical gap therebetween to effect coupling of flux to and from flux paths in said front core portions;

a body of magnetic material superposed in fixed relationship with said magnetic front core portions and bridging said gap to be magnetically coupled thereby to said front core portions;

two corresponding magnetic back cores, each being magnetically coupled with one said front core portion, each said back core having at least three contiguous leg portions abutting said front core portion at spaced locations along a width dimension of said front core portion;

a control winding between each two adjacent leg portions, respectively, of each back core with adjacent control windings of the same back core being coupled to provide oppositely oriented control fluxes and the orientation of corresponding control windings of each corresponding back core being reversed with respect to each other;

said control fluxes between each pair of corresponding leg portions being effective to saturate a portion of said body of magnetic material in an area where it bridges said physical gap and maintain unsaturated, highly permeable portions of said superposed front core and body, separated by said saturated portion of said body, to define a highly permeable signal transfer zone magnetically proximate said gap; and means for varying the magnitudes of said oppositely oriented control fluxes with respect to each other to vary the location of said signal transfer zone along the width dimension.

52. The apparatus of claim 51 further comprising means for applying oppositely oriented control currents to said adjacent control windings provided on each back cover to establish said oppositely oriented control fluxes.

53. A magnetic transducing head arrangement for recording and//or reproducing information, comprising:

a record medium containing a layer of magnetic material;

a magnetic core comprised of two poles defining a magnetic flux path and having a non-magnetic gap between them;

a body of magnetic material which is located magnetically proximate each of said record medium and the gap of said magnetic core;

means for generating a bias control flux in said magnetic core which is coupled into said body of magnetic material to define in said body a signal transfer zone through which magnetic information flux is coupled between said body and said record medium; and a signal winding disposed on said magnetic core and electromagnetically coupled with said flux path for detecting and/or generating the magnetic information flux which is coupled between said body and said record medium.

54. The transducing head arrangement of claim 53 wherein said body of magnetic material is located between said magnetic core and said record medium.

55. The transducing head arrangement of claim 54 wherein said body of magnetic material is in contact with said magnetic core and bridges said gap.

56. A method of recording information on a magnetic storage medium by means of a transducer which includes a core having a pair of magnetic poles defining a width dimension and having a non-magnetic gap along said width dimension that extends between them a defined length and a flux generator coupled to said core for generating information-defining flux which flows in said core and is coupled from said core by means of said gap, comprising the steps of:

positioning a body of magnetic material, having a higher magnetic permeability and lower magnetic coercivity than that of said storage medium, magnetically proximate each of said gap in said transducer and said storage medium;

generating a control flux in said core which is coupled by said non-magnetic gap into said body of magnetic material to saturate a region at a location therein of a size in the direction of the length of the gap which is substantially the same as the size of the length of said non-magnetic gap in said core while leaving an adjacent region unsaturated, said adjacent saturated and unsaturated regions forming a signal transfer zone for effecting the coupling of flux between said body and said storage medium; and generating an information-defining flux in said core which is coupled into said storage medium at the location of said signal transfer zone.

57. The method of claim 56 further including the step of maintaining the spatial relationship of said body of magnetic material to said core fixed.

58. The method of claim 56 further including the steps of:

maintaining said body of magnetic material non-movable relative to said non-magnetic gap; and moving said signal transfer zone in said body relative to said core.

59. The method of claim 56 wherein said adjacent saturated and unsaturated regions have a steep magnetic permeability gradient therebetween.

60. The method of claim 56 further including the step of varying the location of said signal transfer zone within said body of magnetic material along a defined path in the direction of the width dimension defined by said pair of magnetic poles.

61. A method of reproducing information from a magnetic storage medium by means of a transducer which includes a core having a pair of magnetic poles defining a width dimension and having a non-magnetic gap along said width dimension that extends between them a defined length and a flux detector coupled to said core for detecting information-defining flux which is coupled into said core by means of said gap, comprising the steps of: p1 positioning a body of magnetic material, having a higher magnetic permeability and lower magnetic coercivity than that of said storage medium, magnetically proximate each of said gap in said transducer and said storage medium;

generating a control flux in said core which is coupled by said non-magnetic gap into said body of magnetic material to saturate a region at a location therein of a size in the direction of the length of the gap which is substantially the same as the size of the length of said non-magnetic gap in said core while leaving an adjacent region unsaturated, said adjacent saturated and unsaturated regions forming a signal transfer zone for effecting the coupling of information-defining flux between said body and said storage medium; and detecting the information-defining flux in said core which is coupled from said storage medium at the location of said signal transfer zone.

* * * * *